US011899477B2

(12) United States Patent
Barros et al.

(10) Patent No.: US 11,899,477 B2
(45) Date of Patent: Feb. 13, 2024

(54) FLUID FLOW CONTROL SYSTEM COMPRISING A MANIFOLD ASSEMBLY

(71) Applicant: Ichor Systems, Inc., Fremont, CA (US)

(72) Inventors: Philip Ryan Barros, Pleasanton, CA (US); Greg Patrick Mulligan, Milpitas, CA (US)

(73) Assignee: ICHOR SYSTEMS, INC.

(*) Notice: Subject to any disclaimer, the term of this patent is extended or adjusted under 35 U.S.C. 154(b) by 80 days.

(21) Appl. No.: 17/670,723

(22) Filed: Feb. 14, 2022

(65) Prior Publication Data
US 2022/0283596 A1 Sep. 8, 2022

Related U.S. Application Data

(60) Provisional application No. 63/155,861, filed on Mar. 3, 2021.

(51) Int. Cl.
*F16K 27/00* (2006.01)
*G05D 7/06* (2006.01)
*F16K 37/00* (2006.01)

(52) U.S. Cl.
CPC ......... *G05D 7/0652* (2013.01); *F16K 27/003* (2013.01); *F16K 37/005* (2013.01)

(58) Field of Classification Search
CPC ...... G05D 7/0652; G05D 7/0658; G05D 7/00; F16K 27/003; F16K 37/005; H01L 21/67017
USPC .............. 73/1.16, 1.36, 863, 863.01, 863.33, 73/863.81, 863.86; 141/100, 103, 105; 137/597, 602, 605; 222/129, 132, 144.5, 222/145.1
See application file for complete search history.

(56) References Cited

U.S. PATENT DOCUMENTS

| 2,666,297 A | 1/1954 | Skousgaard |
| 3,271,994 A | 9/1966 | Fournier et al. |
| 3,335,748 A | 8/1967 | Klemm et al. |

(Continued)

FOREIGN PATENT DOCUMENTS

| CN | 1461429 A | 12/2003 |
| CN | 1816733 | 8/2006 |

(Continued)

OTHER PUBLICATIONS

International Search Report PCT/US2022/16286 dated Jul. 8, 2022.

*Primary Examiner* — Robert R Raevis
(74) *Attorney, Agent, or Firm* — The Belles Group, P.C.

(57) ABSTRACT

Systems for processing articles are essential for semiconductor fabrication. In one embodiment, a system is disclosed comprising a plurality of fluid supplies configured to supply process fluids, a plurality of apparatuses for controlling flow, a plurality of mounting substrates, a vacuum manifold fluidly coupled to the plurality of mounting substrates, an outlet manifold fluidly coupled to the plurality of mounting substrates, a vacuum source fluidly coupled to the vacuum manifold, and a processing chamber fluidly coupled to the outlet manifold. The plurality of apparatuses for controlling flow have a bleed port and an outlet. The outlets of the plurality of apparatuses are fluidly coupled to corresponding outlet ports of the plurality of mounting substrates. The bleed ports of the plurality of apparatuses are fluidly coupled to the corresponding vacuum ports of the plurality of mounting substrates.

16 Claims, 19 Drawing Sheets

(56) References Cited

U.S. PATENT DOCUMENTS

| | | |
|---|---|---|
| 3,453,861 A | 7/1969 | Levasseur |
| 3,491,946 A | 1/1970 | Muller |
| 3,504,692 A | 4/1970 | Goldstein |
| 3,559,482 A | 2/1971 | Baker et al. |
| 3,570,807 A | 3/1971 | Sturman et al. |
| 3,807,456 A | 4/1974 | Colletti |
| 3,814,541 A | 6/1974 | Dent et al. |
| 3,841,520 A | 10/1974 | Bryant et al. |
| 3,910,113 A | 10/1975 | Brown |
| 4,015,626 A | 4/1977 | Thordarson |
| 4,096,746 A | 6/1978 | Wilson et al. |
| 4,118,009 A | 10/1978 | Chmura |
| 4,203,465 A | 5/1980 | Rissi |
| 4,253,156 A | 2/1981 | Lisle et al. |
| 4,275,752 A | 6/1981 | Collier et al. |
| 4,304,263 A | 12/1981 | Choate |
| 4,315,523 A | 2/1982 | Mahawili et al. |
| 4,327,757 A | 5/1982 | Weevers |
| 4,406,161 A | 9/1983 | Locke et al. |
| 4,462,915 A | 7/1984 | Friedman |
| 4,527,600 A | 7/1985 | Fisher et al. |
| 4,576,043 A | 3/1986 | Nguyen |
| 4,589,440 A | 5/1986 | Panet |
| 4,718,443 A | 1/1988 | Adney et al. |
| 4,741,359 A | 5/1988 | Siebald |
| 4,796,651 A | 1/1989 | Ginn et al. |
| 4,858,643 A | 8/1989 | Vavra et al. |
| 4,888,117 A | 12/1989 | Brown et al. |
| 4,904,285 A | 2/1990 | Yamada et al. |
| 4,918,995 A | 4/1990 | Pearman et al. |
| 5,003,810 A | 4/1991 | Jepson et al. |
| 5,044,199 A | 9/1991 | Drexel et al. |
| 5,052,363 A | 10/1991 | Stiles |
| 5,062,446 A | 11/1991 | Anderson |
| 5,080,131 A | 1/1992 | Ono et al. |
| 5,100,100 A | 3/1992 | Benson et al. |
| 5,100,551 A | 3/1992 | Pall et al. |
| 5,114,447 A | 5/1992 | Davis et al. |
| 5,123,439 A | 6/1992 | Powers |
| 5,129,418 A | 7/1992 | Shimomura et al. |
| 5,152,483 A | 10/1992 | Maeng |
| 5,159,951 A | 11/1992 | Ono et al. |
| 5,161,576 A | 11/1992 | Hekkert et al. |
| 5,187,771 A | 2/1993 | Uchida |
| 5,187,972 A | 2/1993 | Defriez |
| 5,190,068 A | 3/1993 | Philbin |
| 5,259,243 A | 11/1993 | Drexel et al. |
| 5,280,773 A | 1/1994 | Becker |
| 5,285,673 A | 2/1994 | Drexel et al. |
| 5,297,427 A | 3/1994 | Shambayati |
| 5,305,638 A | 4/1994 | Saghatchi et al. |
| 5,311,762 A | 5/1994 | Drexel |
| 5,321,992 A | 6/1994 | Mudd et al. |
| 5,325,705 A | 7/1994 | Tom |
| 5,329,966 A | 7/1994 | Fenimore et al. |
| 5,359,878 A | 11/1994 | Mudd |
| 5,419,133 A | 5/1995 | Schneider |
| 5,439,026 A | 8/1995 | Moriya et al. |
| 5,445,035 A | 8/1995 | Delajoud |
| 5,511,585 A | 4/1996 | Lee |
| 5,542,284 A | 8/1996 | Layzell et al. |
| 5,549,272 A | 8/1996 | Kautz |
| 5,583,282 A | 12/1996 | Tom |
| 5,624,409 A | 4/1997 | Seale |
| 5,653,259 A | 8/1997 | Ramstad |
| 5,660,207 A | 8/1997 | Mudd |
| 5,669,408 A | 9/1997 | Nishino et al. |
| 5,711,786 A | 1/1998 | Hinishaw |
| 5,725,024 A | 3/1998 | Nimberger |
| 5,730,181 A | 3/1998 | Doyle et al. |
| 5,762,086 A | 6/1998 | Ollivier |
| 5,804,717 A | 9/1998 | Lucas |
| 5,816,285 A | 10/1998 | Ohmi et al. |
| 5,819,782 A | 10/1998 | Itafuji |
| 5,865,205 A | 2/1999 | Wilmer |
| 5,868,159 A | 2/1999 | Loan et al. |
| 5,904,170 A | 5/1999 | Harvey et al. |
| 5,911,238 A | 6/1999 | Bump et al. |
| 5,917,066 A | 6/1999 | Eisenmann et al. |
| 5,918,616 A | 7/1999 | Sanfilippo et al. |
| 5,935,418 A | 8/1999 | Chakrabarty et al. |
| 5,944,048 A | 8/1999 | Bump et al. |
| 5,970,801 A | 10/1999 | Ciobanu et al. |
| 5,975,126 A | 11/1999 | Bump et al. |
| 5,988,211 A | 11/1999 | Cornell |
| 6,015,590 A | 1/2000 | Suntola |
| 6,026,834 A | 2/2000 | Azima |
| 6,026,847 A | 2/2000 | Reinicke et al. |
| 6,062,246 A | 5/2000 | Tanaka et al. |
| 6,062,256 A | 5/2000 | Miller et al. |
| 6,074,691 A | 6/2000 | Schmitt et al. |
| 6,080,219 A | 6/2000 | Jha et al. |
| 6,116,269 A | 9/2000 | Maxson |
| 6,119,710 A | 9/2000 | Brown |
| 6,125,869 A | 10/2000 | Horiuchi |
| 6,138,708 A | 10/2000 | Waldbusser |
| 6,152,162 A | 11/2000 | Balazy et al. |
| 6,178,995 B1 | 1/2001 | Ohmi et al. |
| 6,209,571 B1 | 4/2001 | Itoh et al. |
| 6,269,692 B1 | 8/2001 | Drexel et al. |
| 6,298,881 B1 | 10/2001 | Curran et al. |
| 6,303,501 B1 | 10/2001 | Chen et al. |
| 6,314,991 B1 | 11/2001 | Gill |
| 6,352,001 B1 | 3/2002 | Wickert et al. |
| 6,374,859 B1 | 4/2002 | Vu et al. |
| 6,422,256 B1 | 7/2002 | Balazy et al. |
| 6,422,264 B2 | 7/2002 | Ohmi et al. |
| 6,425,281 B1 | 7/2002 | Sheriff et al. |
| 6,443,174 B2 | 9/2002 | Mudd |
| 6,539,968 B1 | 4/2003 | White et al. |
| 6,561,218 B2 | 5/2003 | Mudd |
| 6,564,825 B2 | 5/2003 | Lowery et al. |
| 6,631,334 B2 | 10/2003 | Grosshart |
| 6,642,281 B1 | 11/2003 | Long et al. |
| 6,655,408 B2 | 12/2003 | Linthorst |
| 6,712,084 B2 | 3/2004 | Shajii et al. |
| 6,752,166 B2 | 6/2004 | Lull et al. |
| 6,799,603 B1 | 10/2004 | Moore |
| 6,832,628 B2 | 12/2004 | Thordarson et al. |
| 6,868,862 B2 | 3/2005 | Shajii et al. |
| 6,881,263 B2 | 4/2005 | Lindfors et al. |
| 6,948,508 B2 | 9/2005 | Shajii et al. |
| 7,037,372 B2 | 5/2006 | Lindfors et al. |
| 7,073,392 B2 | 7/2006 | Lull et al. |
| 7,136,767 B2 | 11/2006 | Shajii et al. |
| 7,216,019 B2 | 5/2007 | Tinsley et al. |
| 7,252,032 B2 | 8/2007 | Scheffel et al. |
| 7,334,602 B2 | 2/2008 | Ahn |
| 7,337,805 B2 | 3/2008 | Brown et al. |
| 7,353,841 B2 | 4/2008 | Kono et al. |
| 7,370,664 B2 | 5/2008 | Glite |
| 7,424,346 B2 | 9/2008 | Shajii et al. |
| 7,431,045 B2 | 10/2008 | Mudd et al. |
| 7,474,968 B2 | 1/2009 | Ding et al. |
| 7,552,015 B2 | 6/2009 | Shajii et al. |
| 7,615,120 B2 | 11/2009 | Shajii et al. |
| 7,628,861 B2 | 12/2009 | Clark |
| 7,662,233 B2 | 2/2010 | Sneh |
| 7,680,399 B2 | 3/2010 | Buchanan et al. |
| 7,682,946 B2 | 3/2010 | Ma et al. |
| 7,693,606 B2 | 4/2010 | Ahmad et al. |
| 7,706,925 B2 | 4/2010 | Ding et al. |
| 7,717,061 B2 | 5/2010 | Ishizaka et al. |
| 7,757,554 B2 | 7/2010 | Ding et al. |
| 7,784,496 B2 | 8/2010 | Taskar |
| 7,809,473 B2 | 10/2010 | Shajii et al. |
| 7,826,986 B2 | 11/2010 | McDonald |
| 7,850,779 B2 | 12/2010 | Ma et al. |
| 7,874,208 B2 | 1/2011 | Redemann et al. |
| 7,881,829 B2 | 2/2011 | Yoneda et al. |
| 7,891,228 B2 | 2/2011 | Ding et al. |
| 7,905,139 B2 | 3/2011 | Lull |
| 7,918,238 B2 | 4/2011 | Tanaka et al. |
| 7,922,150 B2 | 4/2011 | Cripps et al. |

(56) References Cited

U.S. PATENT DOCUMENTS

| | | |
|---|---|---|
| 7,974,544 B2 | 7/2011 | Kobayashi |
| 7,979,165 B2 | 7/2011 | Gotoh et al. |
| 8,019,481 B2 | 9/2011 | Yamaguchi et al. |
| 8,100,382 B2 | 1/2012 | Robertson, III et al. |
| 8,104,323 B2 | 1/2012 | Yasuda |
| 8,104,516 B2 | 1/2012 | Moriya et al. |
| 8,112,182 B2 | 2/2012 | Tokuhisa et al. |
| 8,183,781 B2 | 5/2012 | Sangam |
| 8,201,989 B2 | 6/2012 | Itoh et al. |
| 8,205,629 B2 | 6/2012 | Gregor et al. |
| 8,265,795 B2 | 9/2012 | Takahashi et al. |
| 8,282,992 B2 | 10/2012 | Myo et al. |
| 8,291,857 B2 | 10/2012 | Lam et al. |
| 8,293,015 B2 | 10/2012 | Lam et al. |
| 8,340,827 B2 | 12/2012 | Yun et al. |
| 8,343,258 B2 | 1/2013 | Guan |
| 8,343,279 B2 | 1/2013 | Myo et al. |
| 8,356,623 B2 | 1/2013 | Isobe et al. |
| 8,376,312 B2 | 2/2013 | Mudd et al. |
| 8,382,897 B2 | 2/2013 | Sangam |
| 8,408,245 B2 | 4/2013 | Feldman et al. |
| 8,443,649 B2 | 5/2013 | Yasuda et al. |
| 8,460,753 B2 | 6/2013 | Xiao et al. |
| 8,504,318 B2 | 8/2013 | Mendelson et al. |
| 8,505,478 B2 | 8/2013 | Suekane et al. |
| 8,511,337 B2 | 8/2013 | Nishimura |
| 8,573,247 B2 | 11/2013 | Ushigusa et al. |
| 8,744,784 B2 | 6/2014 | Yasuda et al. |
| 8,746,057 B2 | 6/2014 | Yasuda et al. |
| 8,770,215 B1 | 7/2014 | Mudd et al. |
| 8,789,556 B2 | 7/2014 | Yasuda et al. |
| 8,793,082 B2 | 7/2014 | Ding et al. |
| 8,800,589 B2 | 8/2014 | Minami et al. |
| 8,851,105 B2 | 10/2014 | Kashima et al. |
| 8,910,656 B2 | 12/2014 | Yasuda |
| 8,915,262 B2 | 12/2014 | Smirnov |
| 8,985,152 B2 | 3/2015 | Chandrasekharan et al. |
| 9,027,585 B2 | 5/2015 | Smirnov |
| 9,081,388 B2 | 7/2015 | Tanaka et al. |
| 9,169,940 B2 | 10/2015 | Yogo et al. |
| 9,188,989 B1 | 11/2015 | Mudd et al. |
| 9,207,139 B2 | 12/2015 | Jones et al. |
| 9,223,318 B2 | 12/2015 | Takeuchi et al. |
| 9,335,768 B2 | 5/2016 | Taskar et al. |
| 9,690,301 B2 | 6/2017 | Mudd et al. |
| 9,940,004 B2 | 4/2018 | Mayworm |
| 10,663,072 B2 | 5/2020 | Birtcher et al. |
| 10,782,165 B2 | 9/2020 | Mudd et al. |
| 10,801,867 B2 | 10/2020 | Ding |
| 10,838,437 B2 | 11/2020 | Penley et al. |
| 2001/0013363 A1 | 8/2001 | Kitayama et al. |
| 2002/0002996 A1 | 1/2002 | Mudd |
| 2002/0014206 A1 | 2/2002 | Mudd |
| 2002/0046612 A1 | 4/2002 | Mudd |
| 2002/0095225 A1 | 7/2002 | Huang et al. |
| 2004/0007180 A1 | 1/2004 | Yamasaki et al. |
| 2004/0083807 A1 | 5/2004 | Mudd et al. |
| 2005/0056211 A1 | 3/2005 | Lindfors et al. |
| 2005/0087299 A1 | 4/2005 | Okabe et al. |
| 2005/0098906 A1 | 5/2005 | Satoh et al. |
| 2005/0284529 A1 | 12/2005 | Iwabuchi |
| 2006/0005883 A1 | 1/2006 | Mudd et al. |
| 2006/0037644 A1 | 2/2006 | Nishikawa et al. |
| 2006/0060139 A1 | 3/2006 | Meneghini et al. |
| 2006/0060253 A1 | 3/2006 | Yoshida et al. |
| 2006/0124173 A1 | 6/2006 | An |
| 2006/0130755 A1 | 6/2006 | Clark |
| 2006/0185746 A1 | 8/2006 | Doyle |
| 2007/0089789 A1 | 4/2007 | Mudd et al. |
| 2007/0110636 A1 | 5/2007 | Lee et al. |
| 2007/0227659 A1 | 10/2007 | Iizuka |
| 2008/0041481 A1 | 2/2008 | Mudd et al. |
| 2008/0302434 A1 | 12/2008 | Taskar |
| 2008/0305014 A1 | 12/2008 | Honda |
| 2009/0101217 A1 | 4/2009 | Ushigusa et al. |
| 2010/0005904 A1 | 1/2010 | Igarashi |
| 2010/0110399 A1 | 5/2010 | Lyons |
| 2010/0138051 A1 | 6/2010 | Glime |
| 2010/0154895 A1 | 6/2010 | Igarashi |
| 2010/0163135 A1 | 7/2010 | Safronovs |
| 2010/0224264 A1 | 9/2010 | Homan et al. |
| 2010/0269924 A1 | 10/2010 | Yasuda |
| 2011/0108126 A1 | 5/2011 | Monkowski et al. |
| 2012/0116596 A1 | 5/2012 | Yoneda et al. |
| 2012/0132291 A1 | 5/2012 | Monkowski et al. |
| 2012/0180876 A1 | 7/2012 | Hayashi et al. |
| 2012/0318383 A1 | 12/2012 | Yasuda et al. |
| 2013/0092256 A1 | 4/2013 | Yasuda et al. |
| 2013/0092258 A1 | 4/2013 | Yasuda et al. |
| 2013/0118596 A1 | 5/2013 | Horsky |
| 2013/0186499 A1 | 7/2013 | Yada et al. |
| 2014/0034164 A1 | 2/2014 | Yasuda |
| 2014/0069527 A1 | 3/2014 | Mudd et al. |
| 2014/0083514 A1 | 3/2014 | Ding |
| 2014/0158211 A1 | 6/2014 | Ding et al. |
| 2014/0182689 A1* | 7/2014 | Shareef ............ G05D 11/132 137/455 |
| 2014/0182692 A1 | 7/2014 | Hirata et al. |
| 2014/0190578 A1 | 7/2014 | Hayashi |
| 2014/0230915 A1 | 8/2014 | Mudd et al. |
| 2014/0260963 A1 | 9/2014 | Wang |
| 2015/0007897 A1 | 1/2015 | Valentine et al. |
| 2015/0027558 A1 | 1/2015 | Kehoe et al. |
| 2015/0047738 A1 | 2/2015 | Wilson et al. |
| 2015/0121988 A1 | 5/2015 | Banares et al. |
| 2015/0212524 A1 | 7/2015 | Kehoe et al. |
| 2015/0362391 A1 | 12/2015 | Suzuki et al. |
| 2016/0011604 A1 | 1/2016 | Mudd et al. |
| 2016/0018828 A1 | 1/2016 | Mudd et al. |
| 2016/0041564 A1 | 2/2016 | Mudd et al. |
| 2016/0124439 A1 | 5/2016 | Yasuda et al. |
| 2017/0082076 A1 | 3/2017 | Ge |
| 2019/0243393 A1 | 8/2019 | Mudd |
| 2019/0390811 A1 | 12/2019 | Shibata et al. |
| 2020/0258764 A1 | 8/2020 | Penley et al. |
| 2020/0400470 A1 | 12/2020 | Mudd et al. |

FOREIGN PATENT DOCUMENTS

| | | |
|---|---|---|
| CN | 102096420 A1 | 6/2011 |
| CN | 101256935 B | 8/2011 |
| CN | 102354228 | 2/2012 |
| CN | 103838261 | 6/2014 |
| DE | 69535683 | 1/2009 |
| EP | 0468793 | 1/1992 |
| EP | 0671484 | 9/1995 |
| EP | 0689040 | 12/1995 |
| JP | 11119835 | 4/1999 |
| JP | H11223538 | 8/1999 |
| JP | 2000018407 | 1/2000 |
| JP | 2004157719 | 6/2004 |
| JP | 2004302914 | 10/2004 |
| JP | 2007041870 | 2/2007 |
| JP | 4137666 | 8/2008 |
| JP | 4146746 | 9/2008 |
| JP | 2009079667 | 4/2009 |
| JP | 4351495 | 10/2009 |
| JP | 2009300403 | 12/2009 |
| JP | 4572139 | 10/2010 |
| JP | 4589846 | 12/2010 |
| JP | 4700095 B2 | 6/2011 |
| JP | 4705140 | 6/2011 |
| JP | 2011171337 | 9/2011 |
| JP | 4974000 | 7/2012 |
| JP | 5090559 | 12/2012 |
| JP | 5091821 | 12/2012 |
| JP | 2016035462 | 3/2016 |
| TW | 200846860 A | 12/2008 |
| TW | 201414990 | 4/2014 |
| TW | 201631429 A | 9/2016 |
| TW | 201718934 A | 6/2017 |
| WO | WO8700267 | 1/1987 |
| WO | WO2003081361 | 10/2003 |
| WO | WO200401516 | 12/2003 |

(56) References Cited

FOREIGN PATENT DOCUMENTS

| WO | WO2005114016 A1 | 1/2005 |
| WO | WO2011040409 | 4/2011 |
| WO | WO2014/152755 A2 | 9/2014 |
| WO | WO2020214616 A1 | 10/2020 |

* cited by examiner

FLUID FLOW CONTROL SYSTEM COMPRISING A MANIFOLD ASSEMBLY

CROSS-REFERENCE TO RELATED APPLICATIONS

This application claims the benefit of U.S. Provisional Application 63/155,861, filed Mar. 3, 2021, which is incorporated herein by reference in its entirety.

BACKGROUND OF THE INVENTION

Mass flow control has been one of the key technologies used in semiconductor chip fabrication. Apparatuses for controlling mass flow are important for delivering known flow rates of process gases and liquids for semiconductor fabrication and other industrial processes. Such devices are used to measure and accurately control the flow of fluids for a variety of applications. In a given fabrication tool, a variety of liquids and gases might be required. As a result, efficient gas and liquid handling is essential to modern semiconductor fabrication equipment.

As the technology of chip fabrication has improved, so has the demand on the apparatuses for controlling flow. Semiconductor fabrication processes increasingly require increased performance, a greater range of flow capability, more process gases and liquids, and more compact installation of the necessary equipment. Improved gas and liquid handling for a variety of flow apparatuses is desirable to deliver enhanced performance in reduced space and at a reduced cost.

SUMMARY OF THE INVENTION

The present technology is directed to systems for processing articles such as semiconductors. In other embodiments, the present technology is directed to systems for controlling process fluids. In yet other embodiments, the present technology is directed to systems for transporting process fluids. In other embodiments, the present technology is directed to apparatuses for controlling flow of process fluids. The present systems and manifold assemblies may be used in a wide range of processes such as semiconductor chip fabrication, solar panel fabrication, etc.

In one implementation, the invention is a system for processing articles. The system has a first fluid supply configured to supply a first process fluid and a second fluid supply configured to supply a second process fluid. The system has a first apparatus for controlling flow, the first apparatus having an inlet, an outlet, and a bleed port, the inlet of the first apparatus fluidly coupled to the first fluid supply. The system has a second apparatus for controlling flow, the second apparatus having an inlet, an outlet, and a bleed port, the inlet of the second apparatus fluidly coupled to the second fluid supply. The apparatus has first and second mounting substrates, the first mounting substrate having a first vacuum port and a first outlet port, the first apparatus for controlling flow attached to the first mounting substrate such that the bleed port of the first apparatus for controlling flow is fluidly coupled to the first vacuum port and the outlet of the first apparatus for controlling flow is fluidly coupled to the first outlet port. The second mounting substrate has a second vacuum port and a second outlet port, the second apparatus for controlling flow attached to the second mounting substrate such that the bleed port of the second apparatus for controlling flow is fluidly coupled to the second vacuum port and the outlet of the second apparatus for controlling flow is fluidly coupled to the second outlet port. The system has a vacuum manifold fluidly coupled to the first and second vacuum ports, an outlet manifold fluidly coupled to the first and second outlet ports, a vacuum source fluidly coupled to the vacuum manifold, and a processing chamber fluidly coupled to the outlet manifold.

In another implementation, the invention is a system for controlling process fluids. The system has a first apparatus for controlling flow, the first apparatus having an inlet, an outlet, and a bleed port, the inlet of the first apparatus configured to receive a first process fluid. The system has a second apparatus for controlling flow, the second apparatus having an inlet, an outlet, and a bleed port, the inlet of the second apparatus configured to receive a second process fluid. The apparatus has first and second mounting substrates, the first mounting substrate having a first vacuum port and a first outlet port, the first apparatus for controlling flow attached to the first mounting substrate such that the bleed port of the first apparatus for controlling flow is fluidly coupled to the first vacuum port and the outlet of the first apparatus for controlling flow is fluidly coupled to the first outlet port. The second mounting substrate has a second vacuum port and a second outlet port, the second apparatus for controlling flow attached to the second mounting substrate such that the bleed port of the second apparatus for controlling flow is fluidly coupled to the second vacuum port and the outlet of the second apparatus for controlling flow is fluidly coupled to the second outlet port. The system has a vacuum manifold fluidly coupled to the first and second vacuum ports and an outlet manifold fluidly coupled to the first and second outlet ports.

In yet a further implementation, the invention is a system for transporting process fluids. The system has a plurality of mounting substrates, each mounting substrate having a vacuum port and an outlet port. The system has a vacuum manifold fluidly coupled to the vacuum ports of the plurality of mounting substrates. The system also has an outlet manifold fluidly coupled to the outlet ports of the plurality of mounting substrates. The vacuum manifold has a plurality of primary channels extending along a first longitudinal axis and a plurality of feed channels, the vacuum ports of the plurality of mounting substrates fluidly coupled to the plurality of primary channels via the plurality of feed channels. The outlet manifold has a plurality of primary channels extending along a second longitudinal axis, the first and second longitudinal axes being parallel.

In another implementation, the invention is an apparatus for controlling flow of a process fluid. The apparatus has an inlet, an outlet, a bleed port, a flow path extending from the inlet to the outlet, a first valve, a flow restrictor, a second valve, and a mounting portion. The first valve is operably coupled to the flow path and located between the inlet and the outlet, the first valve configured to control flow of a process fluid in the flow path. The flow restrictor has a flow impedance and is operably coupled to the flow path and located between the inlet and the outlet. The second valve is operably coupled to the flow path and located between the inlet and the outlet, the second valve configured to control flow of the process fluid from the flow path to the bleed port. The mounting portion comprises the outlet and the bleed port.

In yet another implementation, the invention is a method of manufacturing articles. The method involves providing a first apparatus for controlling flow of a first process fluid, the first apparatus for controlling flow having a mounting portion. The method further involves providing a first mounting substrate having a surface, the surface having an outlet port and a vacuum port, the outlet port fluidly coupled to an outlet manifold and the vacuum port fluidly coupled to a vacuum manifold. The mounting portion of the first apparatus for controlling flow is secured to the surface of the first mounting substrate. The outlet manifold is fluidly coupled to a processing chamber, and the vacuum manifold is fluidly coupled to a vacuum source. The first process fluid is supplied to the first apparatus for controlling flow. The first process fluid is flowed through the first apparatus for controlling flow. The first process fluid is delivered from the first apparatus for controlling flow to the vacuum port of the first mounting substrate. The first process fluid is discharged through the vacuum manifold to the vacuum source. The first process fluid is delivered from the first apparatus for controlling flow to the outlet port on the first mounting substrate. Finally, a process is performed on an article within the processing chamber.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

DETAILED DESCRIPTION

Figure 1:
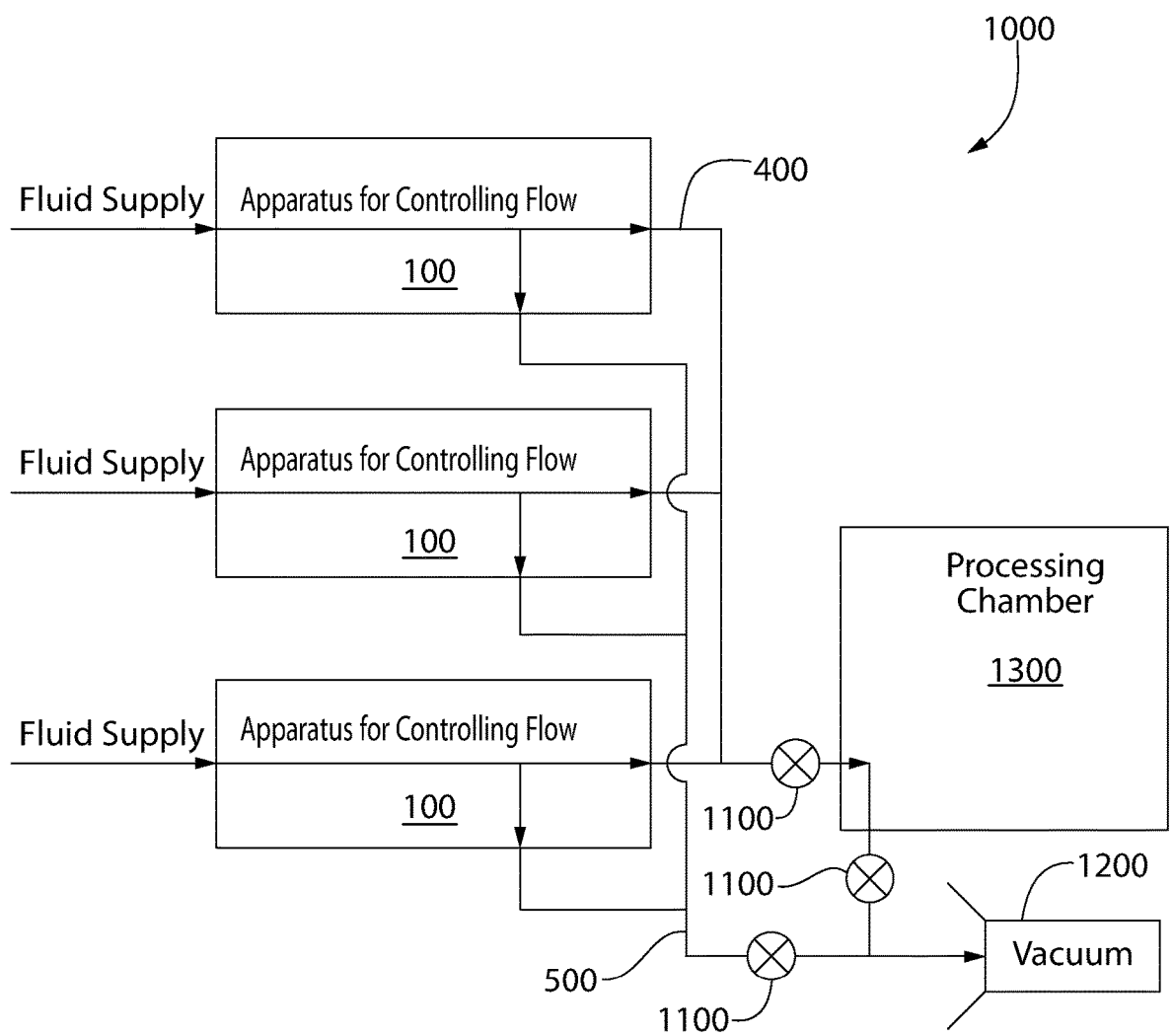
FIG. 1 is a schematic of a system for manufacturing semiconductor devices utilizing one or more apparatuses for controlling flow.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to systems for processing articles, these systems having apparatuses for controlling fluid flow. In some embodiments, the apparatus may function as a mass flow controller to deliver a known mass flow of gas or liquid to a semiconductor or similar process. Semiconductor fabrication is one industry which demands high performance in control of fluid flows. As semiconductor fabrication techniques have advanced, customers have recognized the need for flow control devices with increased accuracy and repeatability in the mass of the delivered fluid flows. In addition, flow control devices have increased in complexity, utilizing more sophisticated arrangements that require delivery and removal of a variety of process fluids.

The present systems enable rapid assembly and maintenance of systems for processing articles by utilizing standardized manifold configurations.

FIG. 1 shows a schematic of an exemplary processing system 1000 for processing articles. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300 via an outlet manifold 400. Articles such as semiconductors may be processed within the processing chamber 1300. A valve 1100 isolates the apparatuses for controlling flow 100 from the processing chamber 1300, enabling the apparatuses for controlling flow 100 to be selectively connected or isolated from the processing chamber 1300. The processing chamber 1300 may contain one or more applicators to apply process fluids delivered by the plurality of apparatus for controlling flow 100, enabling selective or diffuse distribution of the fluid supplied by the plurality of apparatus for controlling flow 100. In addition, the processing system 1000 may further comprise a vacuum source 1200 which is isolated from the processing chamber 1300 by a valve 1100 to enable evacuation of process fluids or facilitate purging one or more of the apparatus for controlling flow 100 to enable switching between process fluids in the same apparatus for controlling flow 100. Each of the apparatuses for controlling flow 100 may have a separate bleed port which is coupled to a vacuum manifold 500, the vacuum manifold connected to the vacuum source 1200 via a valve 1100. Optionally, the apparatuses for controlling flow 100 may be mass flow controllers, flow splitters, or any other device which controls the flow of a process fluid in a processing system. Furthermore, valves 1100 may be integrated into the apparatus for controlling flow 100 if so desired. In some implementations this may eliminate the need for certain other valves 1100 in the processing system 1000.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process fluid.

Figure 2:
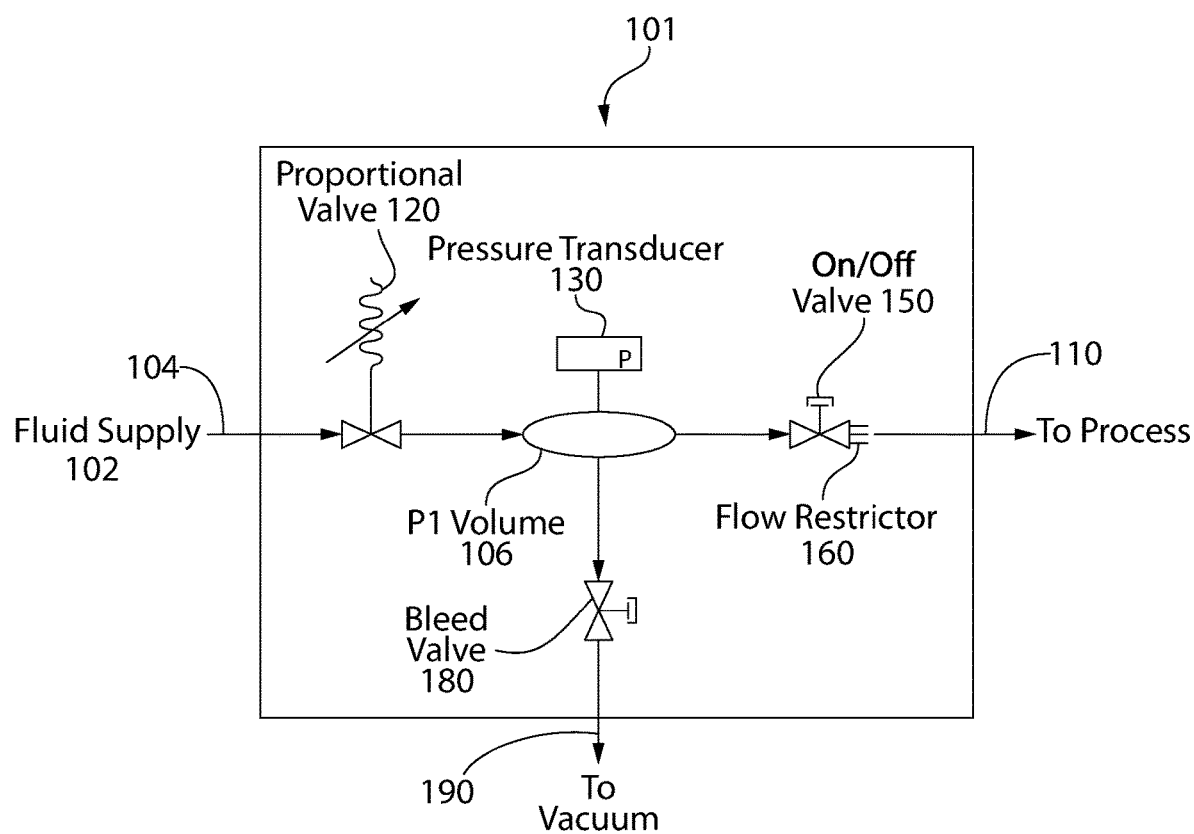
FIG. 2 is a schematic of a mass flow controller, the mass flow controller being one of the apparatuses for controlling flow as may be utilized in the process of FIG. 1.

FIG. 2 shows a schematic of an exemplary mass flow controller 101, which is one type of apparatus for controlling flow 100 that may be utilized in the processing system 1000. The mass flow controller 101 has a fluid supply 102 of a process fluid fluidly coupled to an inlet 104. The inlet 104 is fluidly coupled to a proportional valve 120 which is capable of varying the mass and volume of process fluid flowing through the proportional valve 120. The proportional valve 120 meters the mass flow of process fluid which passes to a P1 volume 106. The proportional valve 120 is capable of providing proportional control of the process fluid such that it need not be fully open or closed, but instead may have intermediate states to permit control of the mass flow rate of process fluid.

The P1 volume 106 is fluidly coupled to the proportional valve 120, the P1 volume 106 being the sum of all the volume within the mass flow controller 101 between the proportional valve 120 and a flow restrictor 160. A pressure transducer 130 is fluidly coupled to the P1 volume 106 to enable measurement of the pressure within the P1 volume 106. A shutoff valve 150 is located between the flow restrictor 160 and the proportional valve 120 and may be used to completely halt flow of the process fluid out of the P1 volume 106. Optionally, the flow restrictor 160 may be located between the shutoff valve 150 and the proportional valve 120 in an alternate configuration. The flow restrictor 160 is fluidly coupled to an outlet 110 of the mass flow controller 101. In the processing system, the outlet 110 is fluidly coupled to a valve 1100 or directly to the processing chamber 1300. In the present embodiment, the flow restrictor 160 is located between the shutoff valve 150 and the outlet 110. In an alternate embodiment, the shutoff valve 150 is located between the flow restrictor 160 and the outlet 110. Thus, the arrangement of the shutoff valve 150 and the flow restrictor 160 may be reversed. Finally, a bleed valve 180 is coupled to the P1 volume 106 and to a bleed port 190. The bleed valve 180 may be a proportional valve, on/off valve, or any other type of valve suitable for controlling fluid flow. Optionally, a second flow restrictor may be incorporated between the P1 volume and the bleed port 190.

Internal to the first shutoff valve 150 is a valve seat and a closure member. When the apparatus 100 is delivering process fluid, the first shutoff valve 150 is in an open state, such that the valve seat and the closure member are not in contact. This permits flow of the process fluid and provides a negligible restriction to fluid flow. When the first shutoff valve 150 is in a closed state the closure member and the valve seat are biased into contact by a spring, stopping the flow of process fluid through the first shutoff valve 150.

The flow restrictor 160 is used, in combination with the proportional valve 120, to meter flow of the process fluid. In most embodiments, the flow restrictor 160 provides a known restriction to fluid flow. The first characterized flow restrictor 160 may be selected to have a specific flow impedance so as to deliver a desired range of mass flow rates of a given process fluid. The flow restrictor 160 has a greater resistance to flow than the passages upstream and downstream of the flow restrictor 160.

Optionally, the mass flow controller 101 comprises one or more P2 pressure transducers downstream of the flow restrictor 160 and the shutoff valve 150. The P2 pressure transducer is used to measure the pressure differential across the flow restrictor 160. In some embodiments, the P2 pressure downstream of the flow restrictor 160 may be obtained from another apparatus 100 connected to the processing chamber, with the readings communicated to the mass flow controller 101.

Optionally, temperature sensors may be employed to further enhance the accuracy of the mass flow controller 101. They may be mounted in the base of the mass flow controller 101 near the P1 volume 106. Additional temperature sensors may be employed in a variety of locations, including adjacent the proportional valve 120, the pressure transducer 130, the shutoff valve 150, and the bleed valve 180.

Figure 3:
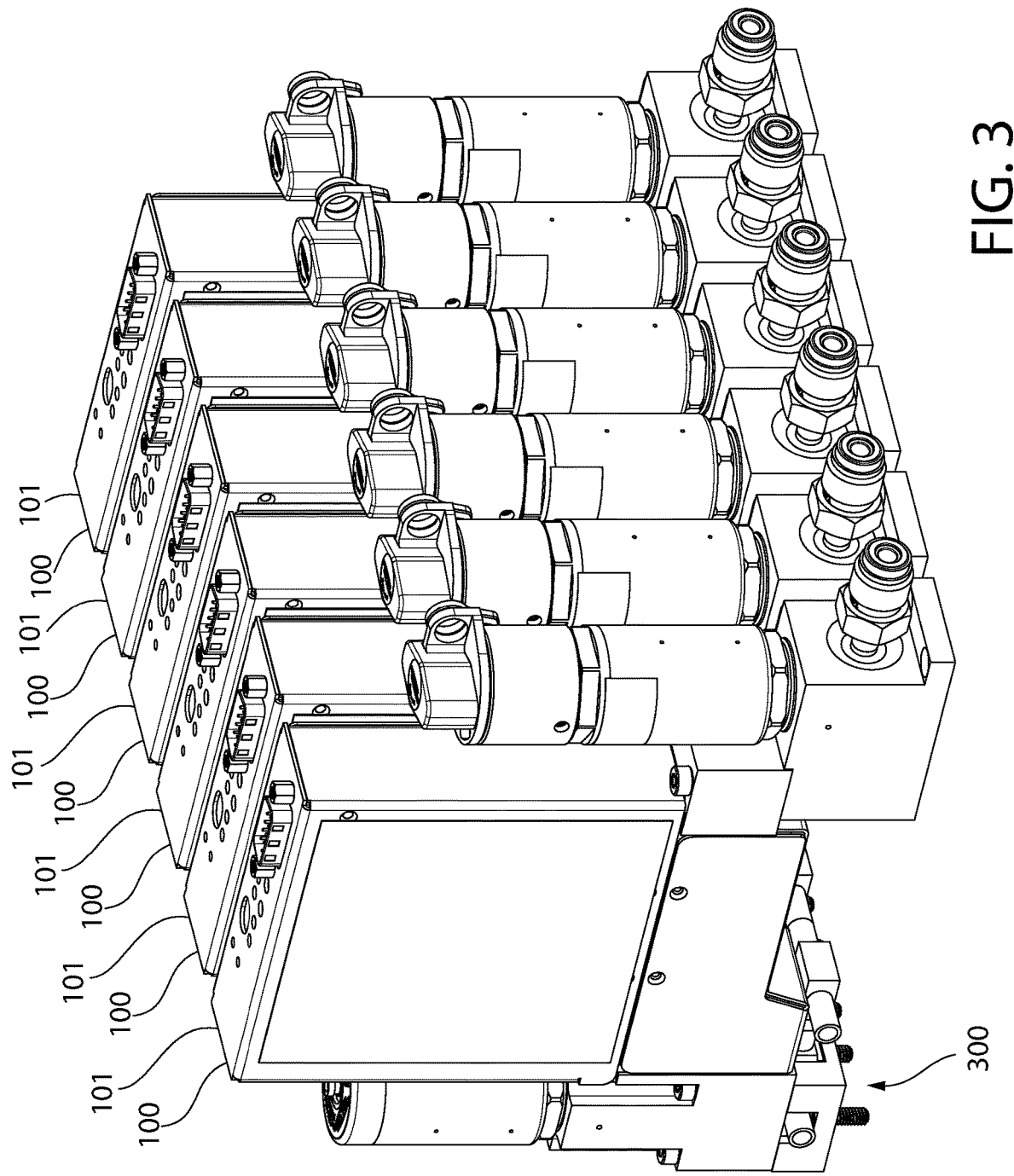
FIG. 3 is a perspective view of a plurality of apparatuses for controlling flow and a manifold system as may be utilized in the system of FIG. 1.
Figure 4:
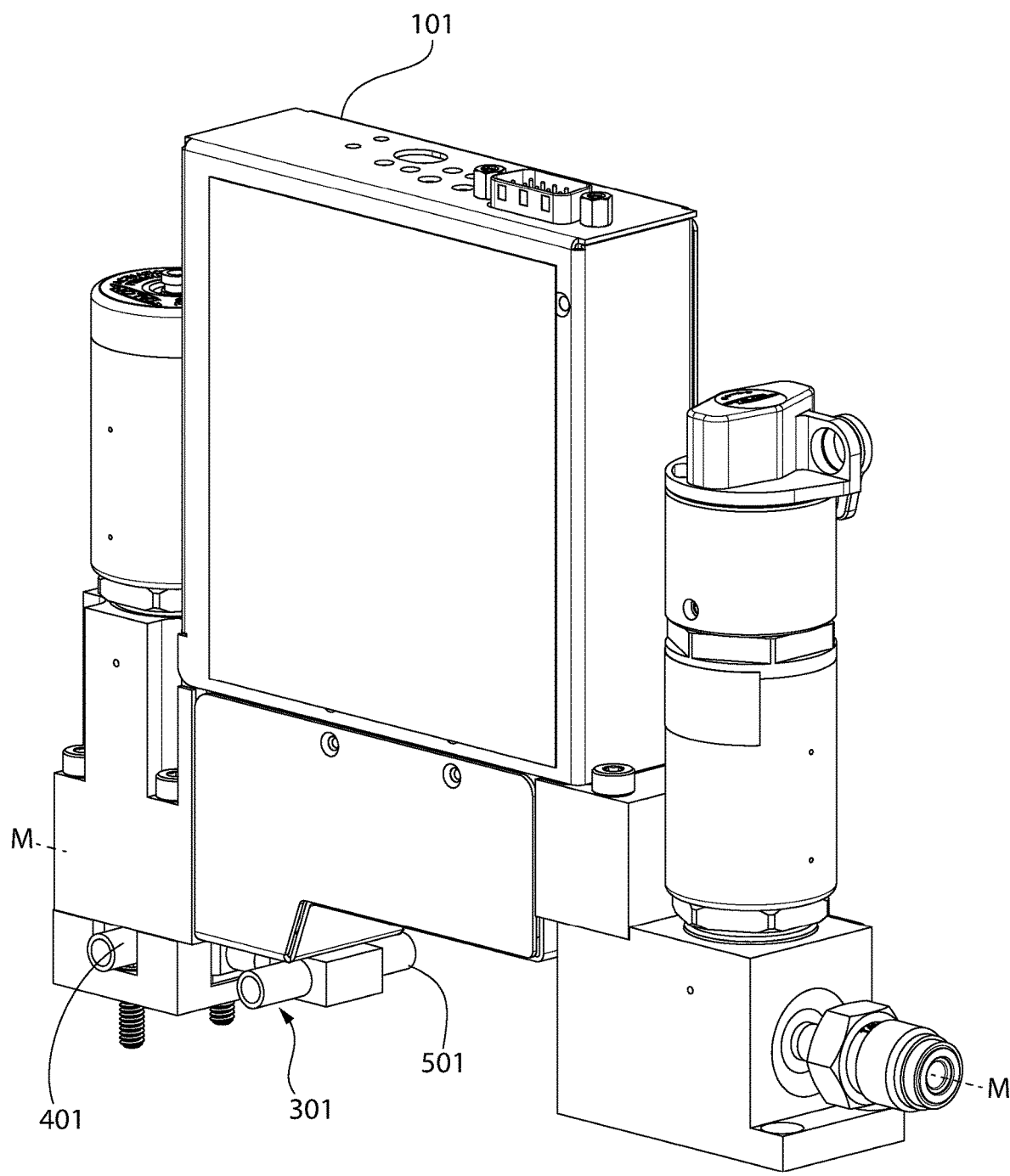
FIG. 4 is a perspective view of a mass flow controller and a portion of the manifold system, the mass flow controller being one of the apparatuses for controlling flow as may be utilized in the system of FIG. 1.
Figure 5:
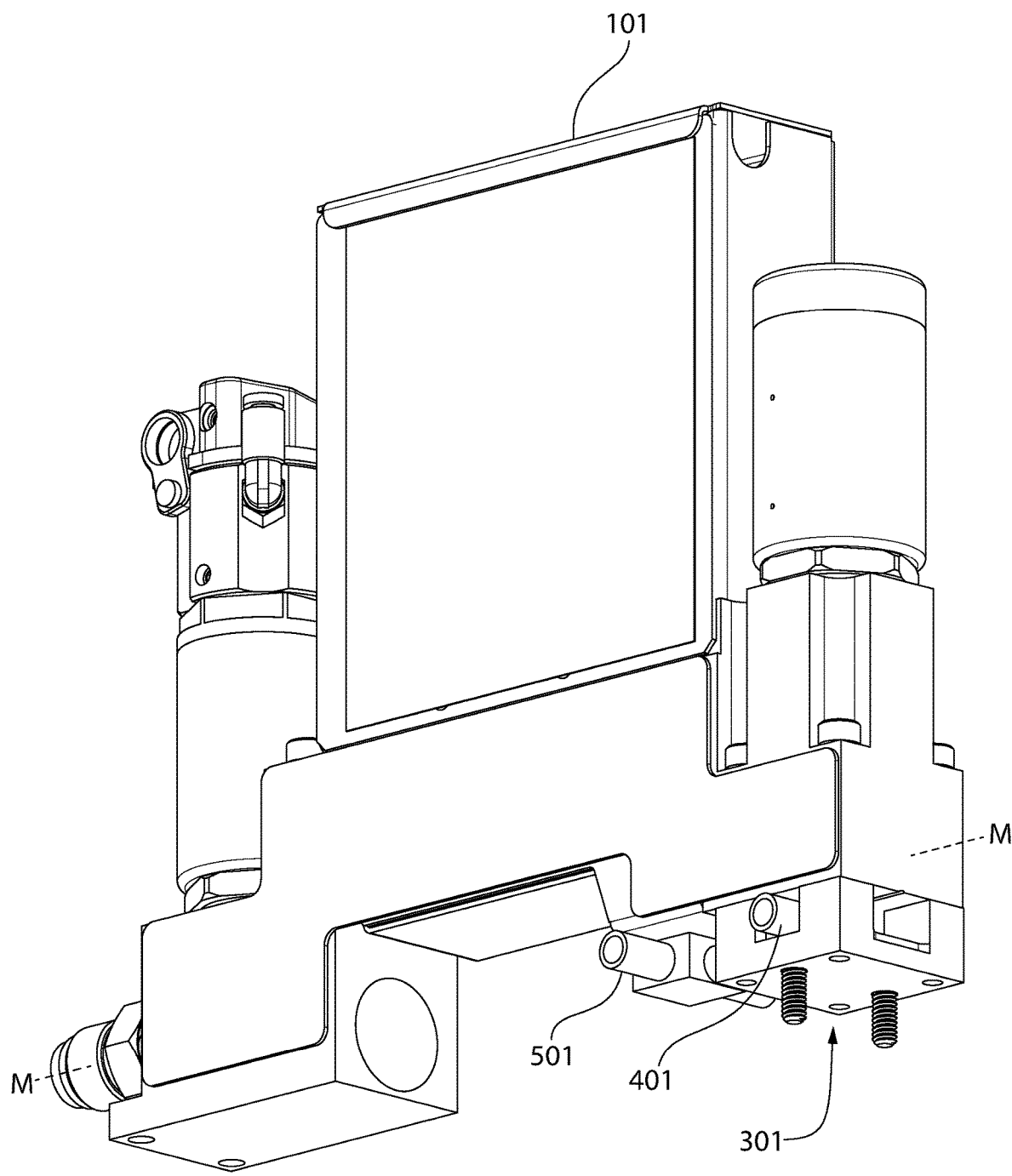
FIG. 5 is a lower perspective view of the mass flow controller and the portion of the manifold system of FIG. 4.
Figure 6:
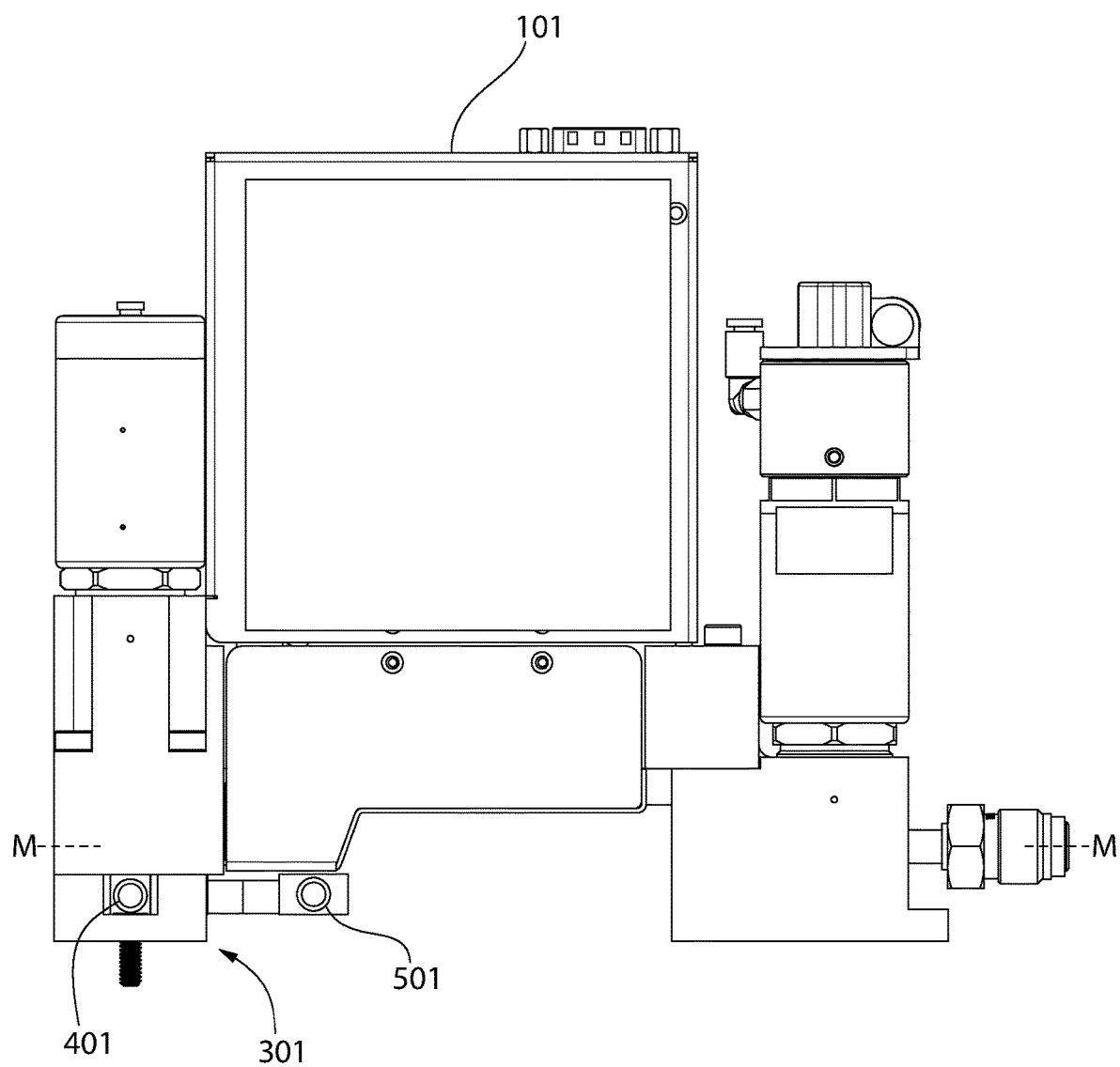
FIG. 6 is a left side view of the mass flow controller and the portion of the manifold system of FIG. 4.
Figure 7:
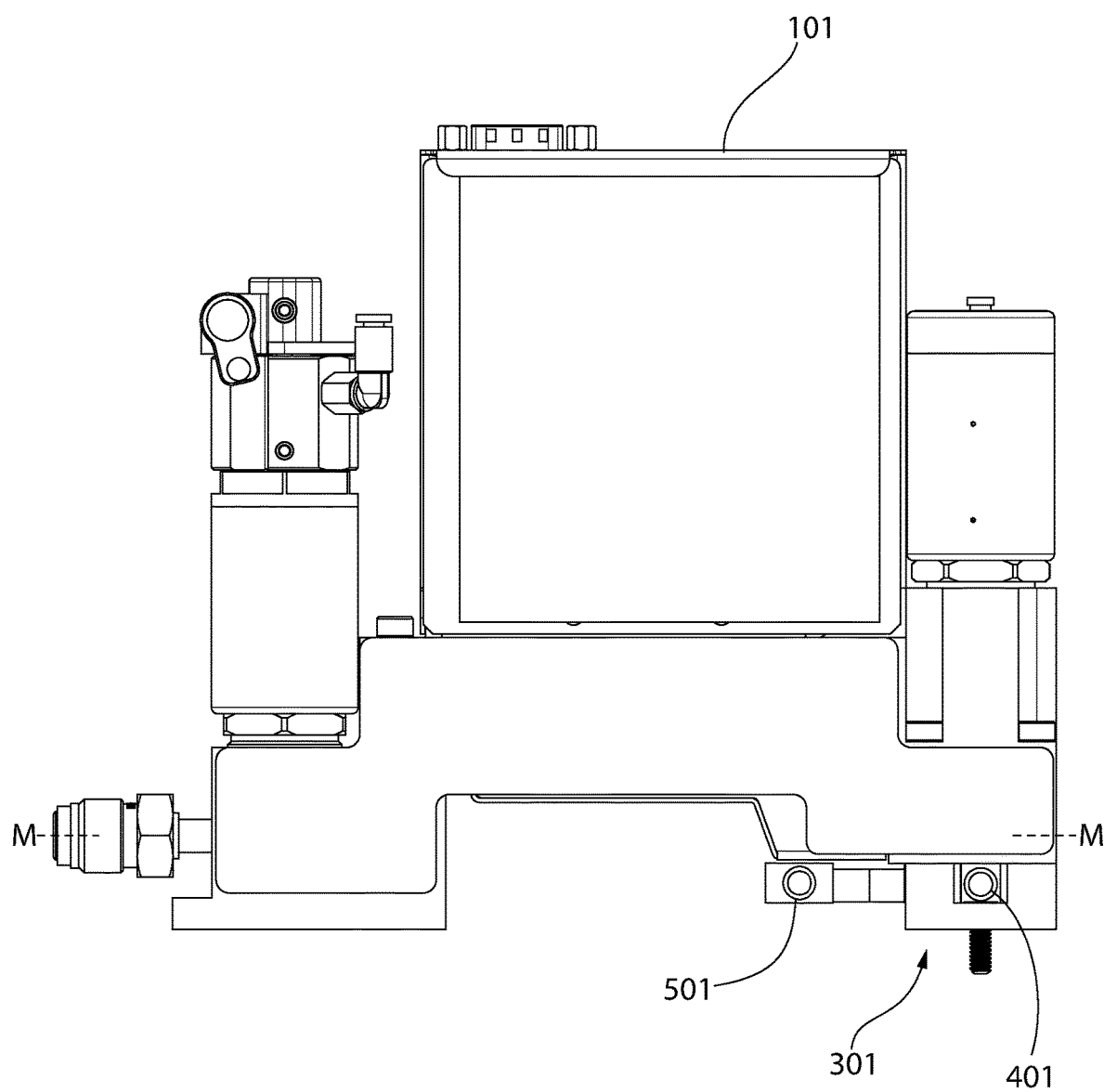
FIG. 7 is a right side view of the mass flow controller and the portion of the manifold system of FIG. 4.
Figure 8:
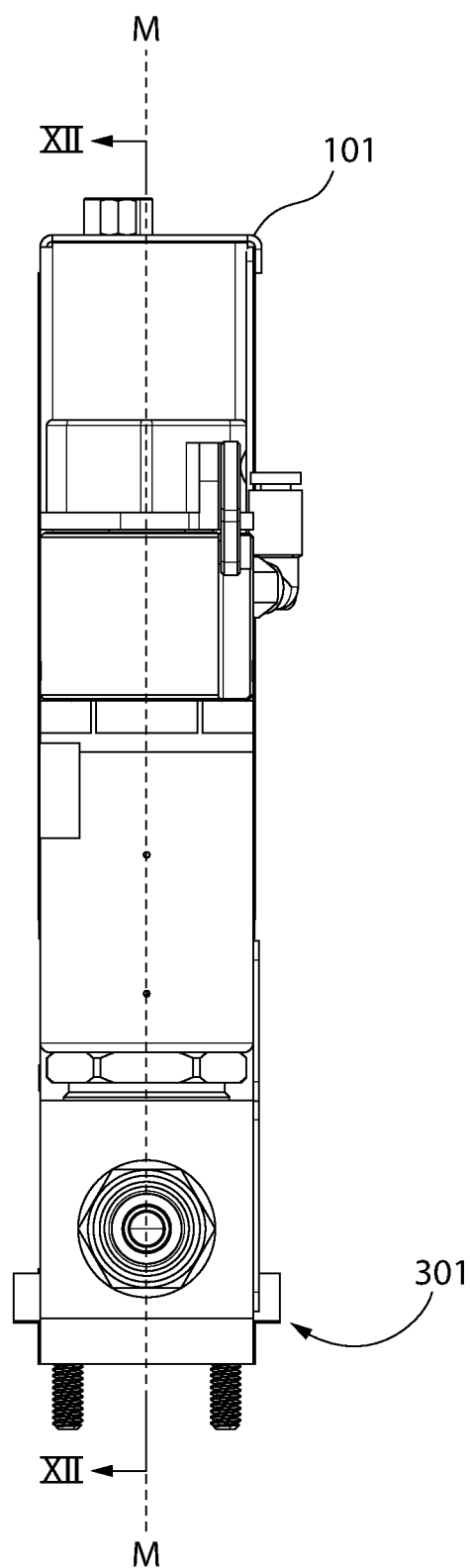
FIG. 8 is a front view of the mass flow controller and the portion of the manifold system of FIG. 4.
Figure 9:
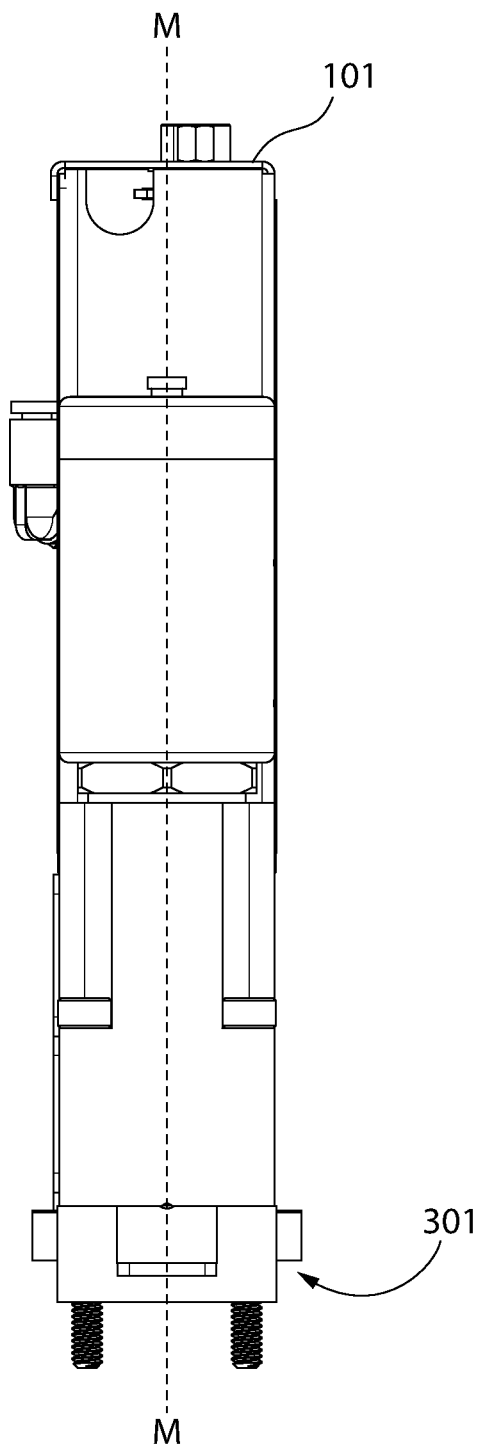
FIG. 9 is a rear view of the mass flow controller and the portion of the manifold system of FIG. 4.
Figure 10:
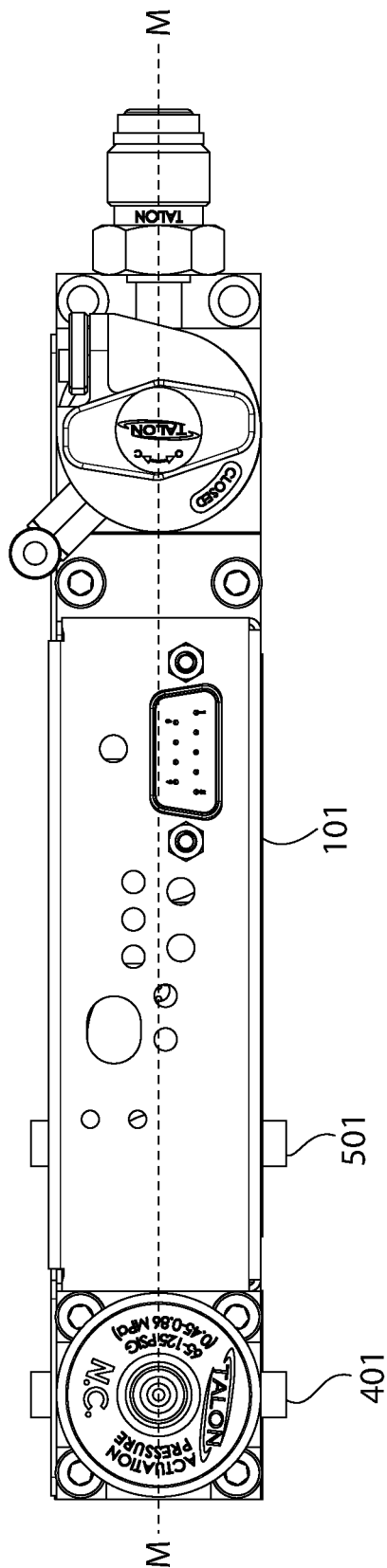
FIG. 10 is a top view of the mass flow controller and the portion of the manifold system of FIG. 4.
Figure 11:
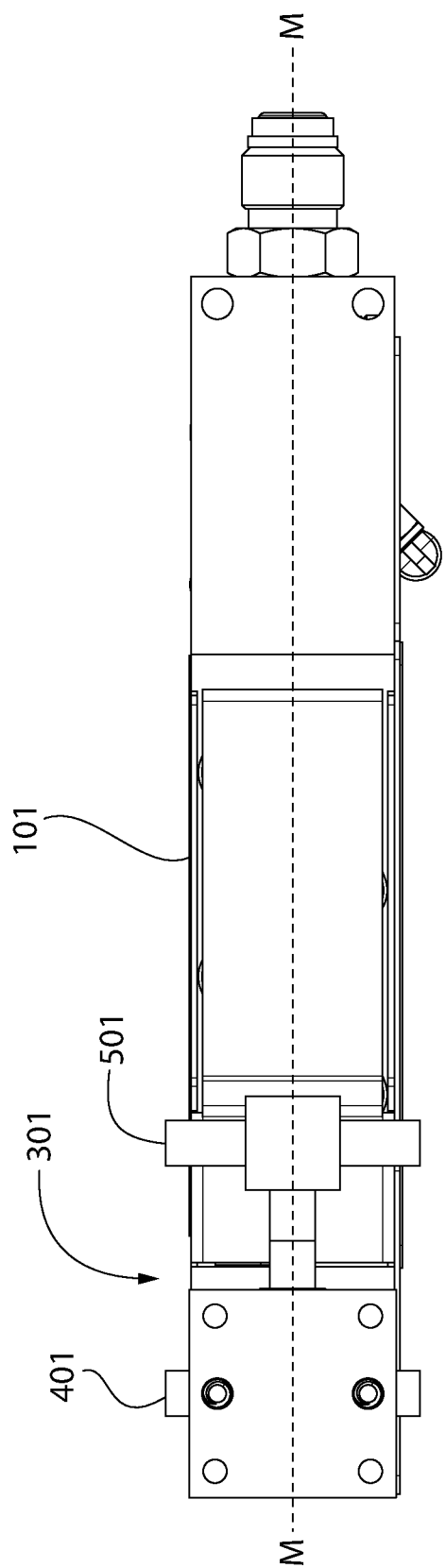
FIG. 11 is a bottom view of the mass flow controller and the portion of the manifold system of FIG. 4.

Turning to FIG. 3, a perspective view of a plurality of apparatuses for controlling flow 100 and a manifold system 300 are shown. As can be seen, six apparatuses 100 are provided in a row. In this example, each of the apparatuses 100 are mass flow controllers 101, but each of the apparatuses 100 could be different devices. Furthermore, not every mass flow controller 101 need be identical. Some may support different fluids, different ranges of flow capability, or any other variation necessary to implement the desired process. As can be seen, the mass flow controllers 101 are mounted to the manifold system 300.

FIGS. 4-12 show a single mass flow controller 101 in greater detail, along with a portion 301 of the manifold system 300. The portion 301 provides the necessary attachment features to mount the mass flow controller 101 or other apparatuses 100 in a standardized configuration. The manifold system enables both vacuum and outlet manifolds to be connected with a minimum of complexity as will be described in greater detail below.

Figure 12:
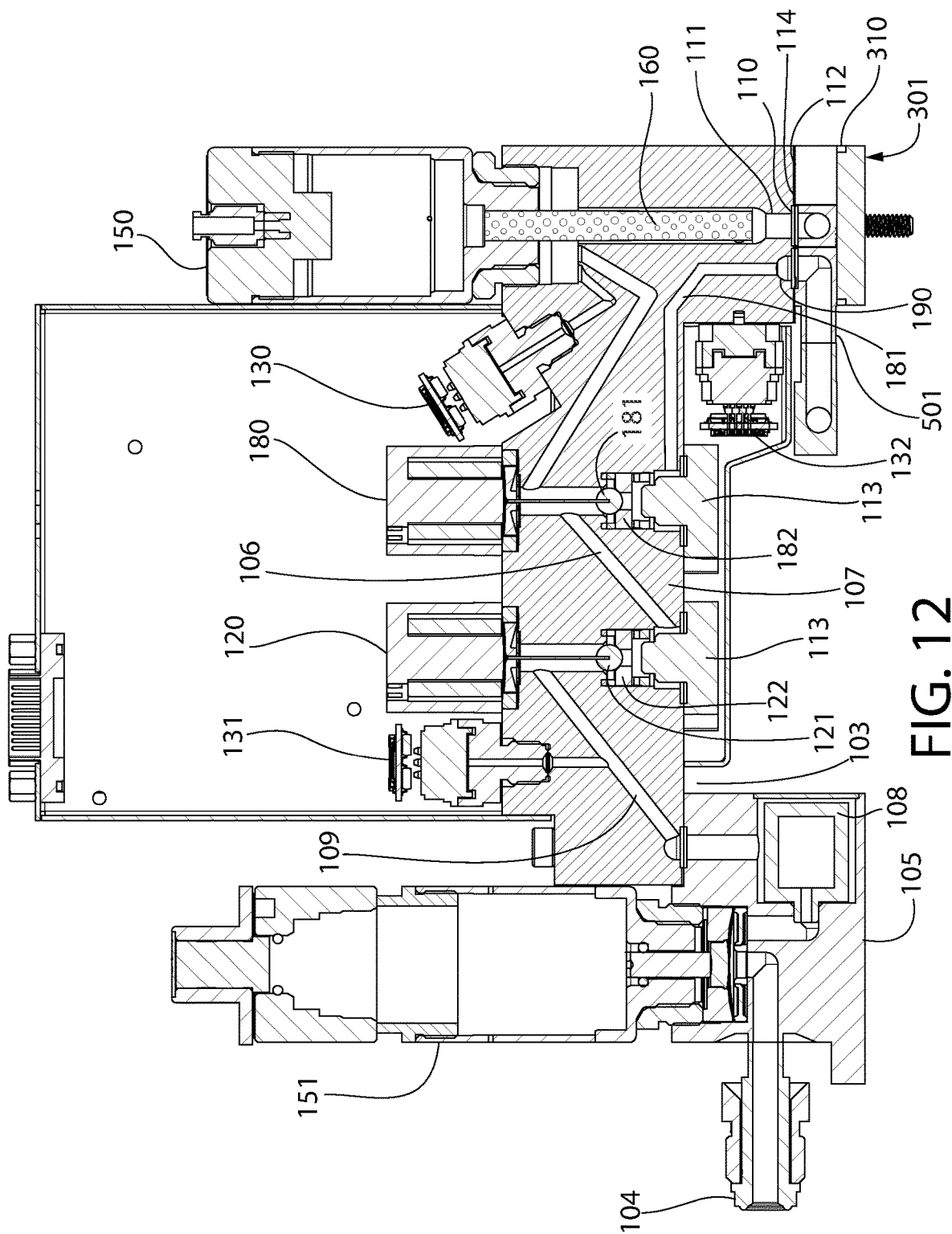
FIG. 12 is a cross-sectional view of the mass flow controller and the portion of the manifold system of FIG. 8, taken along line XII-XII.

Turning to FIG. 12, a cross-section of the mass flow controller 101 and the portion 301 of the manifold system 300 are shown. The mass flow controller 101 comprises a base 103 formed of a first portion 105 and a second portion 107. In some embodiments the base 103 is unitary and monolithic, while in other instances the base 103 may be formed of more than two portions. The base 103 comprises an inlet 104 and an outlet 110, a flow path extending from the inlet 104 to the outlet 110. The inlet 104 is fluidly coupled to a fluid supply 102 as discussed above. Process fluids flow from the inlet 104 to the outlet 110 along the flow path, the inlet 104 being referred to as upstream and the outlet 110 being referred to as downstream, as this is the ordinary direction for fluid flow during operation of the mass flow controller 101. Both the inlet 104 and the outlet 110 lie in a plane M-M which extends through the center of the mass flow controller 101 as shown in FIGS. 4-11. The base 103 further comprises valve caps 113 which close off passages. The valve caps 113 are used to facilitate manufacturing of the base 103 and aid in assembly of the mass flow controller 101.

The inlet 104 is fluidly coupled to an inlet control valve 151, the inlet control valve 151 serving to control the flow of fluid into the mass flow controller 101. The primary function of the inlet control valve 151 is to provide guaranteed shutoff of the mass flow controller 101 for maintenance, service, calibration, etc. The inlet control valve 151 may be manually or automatically operated. In some embodiments, the inlet control valve 151 may be omitted.

Downstream of the inlet control valve 151, an integrated particle filter 108 is installed in the first portion 105 of the base 103. Optionally, the integrated particle filter 108 may be omitted. Alternatively, it may be located upstream of the inlet control valve 151 or elsewhere in the flow path. In yet other embodiments, the integrated particle filter 108 may be omitted. Fluid flows past a P0 pressure transducer 131, which is fluidly coupled to a P0 volume 109 located between the inlet control valve 151 and a proportional valve 120. The P0 volume 109 comprises all volume in the flow path between the inlet control valve 151 and a valve seat 122 of the proportional control valve.

The proportional valve 120 comprises the valve seat 122 and a closure member 121. The proportional valve is configured to transition from a closed state to an open state as well as any intermediate position between the open and the closed states. This allows a variable volume of gas or liquid to pass the proportional valve 120. Downstream of the proportional valve 120 is a shutoff valve 150 and a characterized restrictor 160. As discussed above, the shutoff valve 150 may be upstream or downstream of the characterized restrictor 160. In this embodiment, the volume between the proportional valve 120 and the characterized restrictor 160 is referred to as a P1 volume 106. The P1 volume 106 comprises all volume in the flow path between the valve seat 122 of the proportional valve 120 and the characterized restrictor 160.

A bleed valve 180 and a P1 pressure transducer 130 are fluidly coupled to the P1 volume 106 between the proportional valve 120 and the characterized restrictor 160. The bleed valve 180 comprises a closure member 181 and a valve seat 182. The P1 pressure transducer 130 measures the pressure of the fluid in the P1 volume 106. The bleed valve 180 is configured to vent fluid from the P1 volume 106 to a bleed port 190. The bleed port 190 must be connected to a vacuum manifold to dispose of process fluids. The vacuum manifold is discussed below in greater detail.

The characterized restrictor 160 is located downstream of the shutoff valve 150 and upstream of the outlet 110 as discussed above. The characterized restrictor 160 is configured such that it provides a restriction to fluid flow to provide a pressure differential between the P1 volume 106 and a P2 volume 111. The P2 volume 111 comprises the volume of the flow path between the characterized restrictor 160 and the outlet 110. The P2 volume 111 is fluidly coupled to a P2 pressure transducer 132, the P2 pressure transducer 132 measuring the pressure of the fluid in the P2 volume 111. The restriction to fluid flow of the characterized restrictor 160 may also be referred to as a flow impedance, the flow impedance being sufficiently high that the pressure drop across the characterized restrictor 160 can be measured using the P1 and P2 pressure transducers 130, 132.

In some embodiments, the characterized restrictor 160 may be upstream of the shutoff valve 150. In some embodiments, the characterized restrictor 160 may be at least partially located within the shutoff valve 150. In yet other embodiments, the shutoff valve 150 may be omitted. The P1 and P2 pressure transducers 130, 132 may also be omitted in certain embodiments. In yet other embodiments, one or more of the P0, P1, and P2 pressure transducers 131, 130, 132 may be differential pressure sensors, and may be fluidly coupled to more than one of the P0, P1, and P2 volumes 109, 106, 111 to permit differential pressure measurement between the P0, P1, and P2 volumes 109, 106, 111.

Returning to the bleed valve 180 and the bleed port 190, it can be seen that the bleed valve 180 controls flow through a bleed passage 181 that connects the bleed valve 180 to the bleed port 190. This bleed passage 181 may take any required path to reach a mounting portion 112. The mounting portion 112 forms a portion of the base 103 and has a surface 114 comprising the bleed port 190 and the outlet 110. In a preferred embodiment, the surface 114 of the mounting portion 112 is planar. The mounting portion 112 enables connection of the mass flow controller 101 to the portion 301 of the manifold system 300.

The portion 301 of the manifold system 300 comprises a portion 501 of the vacuum manifold 500 and a portion 401 of the outlet manifold 400. The portion 301 of the manifold system 300 further comprises a mounting substrate 310. The 3 310 provides the mechanical connection for the mounting portion 112 of the mass flow controller 101. The mounting substrate 310 provides both structural strength and rigidity to the mass flow controller 101 and ensures robust fluid connection between the two components. The mounting portion 112 of the mass flow controller 101 is configured to engage the mounting substrate 310 to fluidly couple the outlet 110 and the bleed port 190 to the vacuum manifold 500 and the outlet manifold 400. The surface 114 of the mounting portion 112 may incorporate features necessary to ensure that the bleed port 190 and outlet 110 can be adequately sealed to ensure liquid and/or gas tight connections between the mounting portion 112 and the mounting substrate 310. These features may include recesses or any other feature necessary to provide room for sealing features, seals, or other components that provide a fluid-tight connection.

Figure 13:
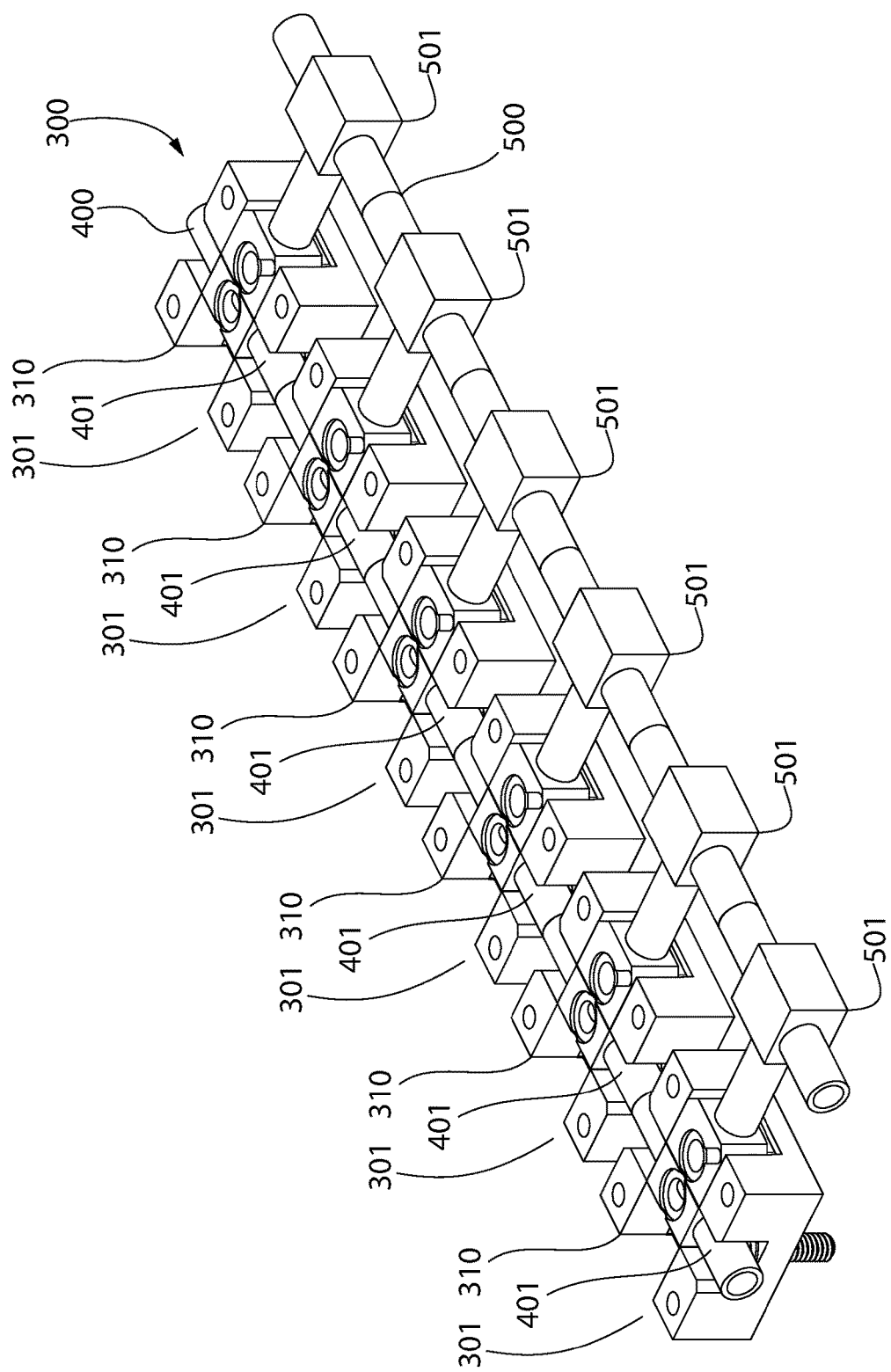
FIG. 13 is a perspective view of the manifold system of FIG. 3.
Figure 14:
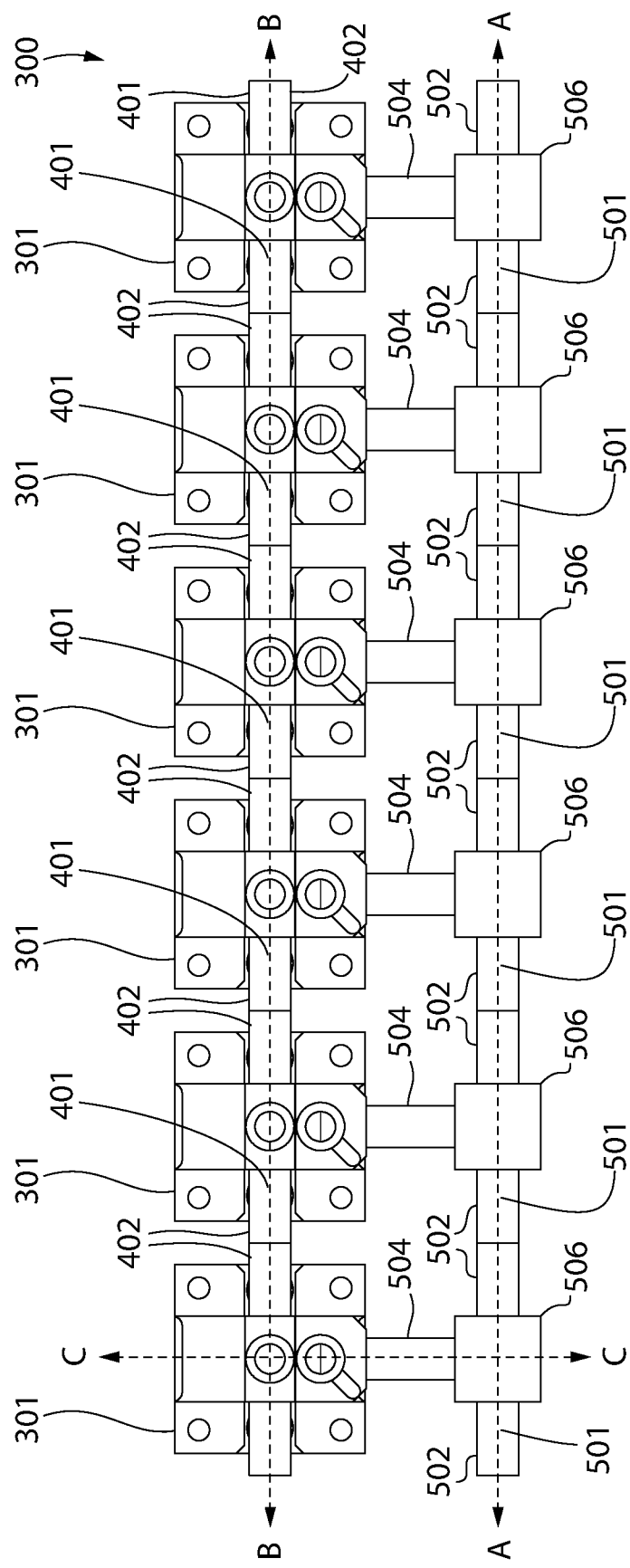
FIG. 14 is a top view of the manifold system of FIG. 3.

Turning to FIGS. 13 and 14, the manifold system 300 is shown in greater detail. The manifold system 300 comprises a plurality of portions 301, each portion 301 being substantially identical. Each of the portions 301 comprises a portion 401 of the outlet manifold 400 and a portion 501 of the vacuum manifold 500. As can be seen, the portions 401 of the outlet manifold 400 collectively form the outlet manifold 400 and the portions 501 of the vacuum manifold 500 collectively form the vacuum manifold 500. Each portion 301 comprises a mounting substrate 310.

The vacuum manifold 500 extends along a longitudinal axis A-A, the longitudinal axis A-A being coaxial with a plurality of primary channels 502. The longitudinal axis A-A extends perpendicular to the plane M-M, which extends through the inlet 104 and the outlet 110 of the mass flow controller 101. Optionally, a first one of the portions 301 of the manifold system 300 may not comprise a primary channel 502 so that it may be sealed and may terminate the vacuum manifold 500. The first one of the portions 301 may also comprise a primary channel 502 that is coupled to another tubing system or may be coupled to the vacuum source 1200 as discussed above. A last one of the portions 301 comprises a primary channel 502 that is fluidly coupled to the vacuum source 1200 to ensure that the vacuum manifold 500 is under vacuum.

The primary channels 502 are coupled to a plurality of feed channels 504 via a plurality of tee fittings 506. The feed channels 504 extend along a longitudinal axis C-C, the longitudinal axis C-C being perpendicular to the longitudinal axis A-A. The longitudinal axis C-C extends parallel to the plane M-M, which extends through the inlet 104 and the outlet 110 of the mass flow controller 101. The feed channels 504 couple to the mounting substrates 310 and permit fluid connection of the mounting substrates 310 to the plurality of primary channels 502. Thus, fluid flows from the bleed ports 190 of the plurality of apparatuses 100, through the mounting substrates 310, through the feed channels 504 to the primary channels 502, and then on to the vacuum source. The primary channels 502 and the feed channels 504 may be pipe nipples, lengths of pipe, or other tubular members that conduct fluids. They may be coupled to the mounting substrates 310 and the tee fittings 506 via any known method, including threading, welding, soldering, slip fits, compression fits, mounting flanges, monolithic construction, and the like. Although the primary channels 502 are shown in two parts, each primary channel 502 may be integrally formed such that it extends between adjacent tee fittings 506. In some embodiments, the feed channels 504 may not extend perpendicular to the longitudinal axis A-A and may be angled with respect to the longitudinal axis A-A at an angle other than 90 degrees.

The outlet manifold 400 extends along a longitudinal axis B-B, the longitudinal axis B-B being parallel to the longitudinal axis A-A and spaced from the longitudinal axis A-A. The longitudinal axis B-B extends perpendicular to the plane M-M, which extends through the inlet 104 and the outlet 110 of the mass flow controller 101. The outlet manifold 400 comprises a plurality of primary channels 402 which connect the mounting substrates 310. They may be attached to the mounting substrates via any known method, including threading, welding, soldering, slip fits, compression fits, mounting flanges, monolithic construction, and the like. Although the primary channels 402 are shown in two parts, each primary channel 402 may be integrally formed such that it extends between adjacent mounting substrates 310. In some embodiments, the longitudinal axis B-B may not extend parallel to the longitudinal axis A-A and may be angled with respect to the longitudinal axis A-A.

Turning to FIGS. 15-18, the portions 301 of the manifold system 300 are discussed in greater detail. A single portion 301 is shown in FIGS. 15-18, but the other portions 301 are substantially identical. As can be seen, the single portion 301 comprises the portion 401 of the outlet manifold 400 and the portion 5101 of the vacuum manifold. The portion 301 also comprises the mounting substrate 310. The mounting substrate 310 comprises a cradle 320 and a port block 330. The port block 330 comprises a first portion 340 and a second portion 350. The first portion 340 comprises an outlet port 341 while the second portion 350 comprises a vacuum port 351. In some embodiments, the port block 330 is formed as a single unitary monolithic component, with the first and second portions 340, 350 being portions of a single component. In other embodiments, such as the one shown, the port block 330 is formed such that the first and second portions 340, 350 are individual components.

The mounting substrate 310 further comprises a 312, the surface 312 being substantially planar. The cradle 320 and the port block 330 each form a portion of the surface 312, permitting the mounting portion 112 of the mass flow controller 101 to seal against the surface 312. The outlet port 341 and the vacuum port 351 are formed into the surface 312. Four mounting holes 322 are provided in the cradle 320 to permit attachment of an apparatus for controlling flow 100 such as the mass flow controller 101. Two bolts 314 are provided for attaching the mounting substrate 310 to another object such as a bench, frame, or other structure within the factory where the system is installed. These bolts 314 may be installed in counterbored through-holes which extend through the cradle 320. Alternatively, any other known attachment technique may be used.

Figure 15:
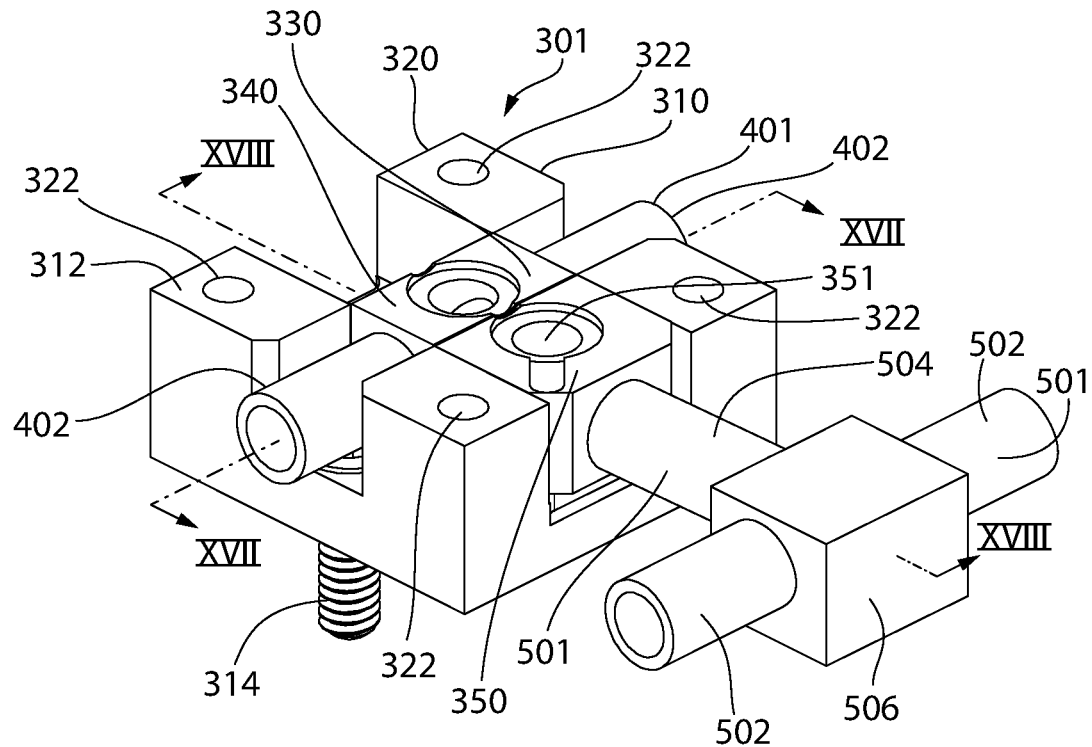
FIG. 15 is a perspective view of a mounting substrate of the manifold system of FIG. 3 and portions of the vacuum and outlet manifolds.
Figure 16:
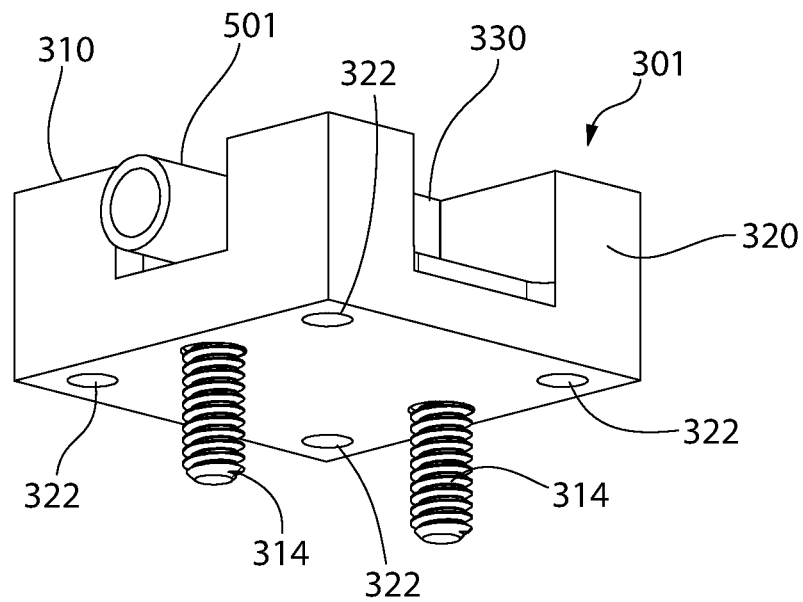
FIG. 16 is a bottom perspective view of the mounting substrate of FIG. 15.
Figure 17:
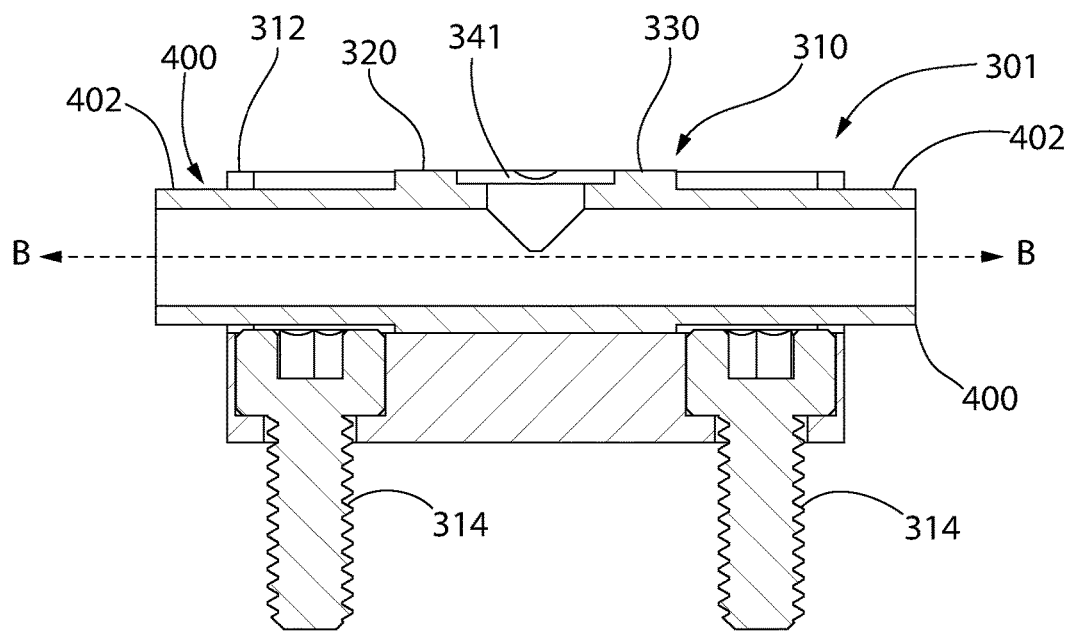
FIG. 17 is a cross-sectional view of the mounting substrate of FIG. 15, taken along line XVII-XVII.

Turning to FIG. 17, a cross-section along the line XVII-XVII of FIG. 15 is shown. In FIG. 17, the portion 301 is shown cut through the outlet manifold 400 and associated portions of the mounting substrate 310. As can be seen, the outlet manifold 400 extends along the axis B-B. The cradle 320 supports the outlet manifold 400 and the port block 320, with the first portion 340 of the port block 330 being visible. The fluid flow path from the outlet port 341 of the first portion 340 of the port block 330 to the primary channels 402 of the outlet manifold 400 is best shown in this view.

Figure 18:
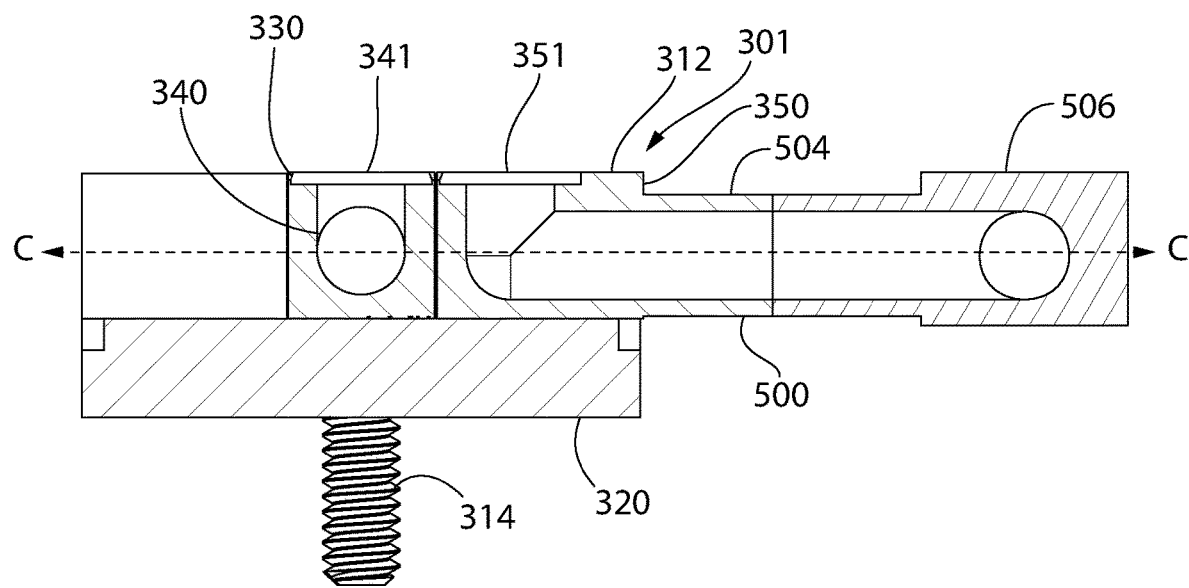
FIG. 18 is a cross-sectional view of the mounting substrate of FIG. 15, taken along line XVIII-XVIII.

FIG. 18 shows a cross-section along the line XVIII-XVIII of FIG. 15. In FIG. 18, the portion 301 is shown sectioned through the first and second portions 340, 350 of the port block 330. As can be seen, the vacuum port 351 of the second portion 350 is fluidly coupled to one of the feed channels 504 of the vacuum manifold 500. Fluid from the vacuum port 351 travels into the second portion 350, turning a right angle and then proceeding along the feed channel 504 until it reaches the tee fitting 506. The outlet port 341 of the first portion 340 is also shown, with the fluid turning at a right angle until it reaches the outlet manifold 400. The cradle 320 supports the port block 330 such that the surface 312 is substantially planar, ensuring effective sealing of the mass flow controller 101 with the mounting substrate 110.

Figure 19:
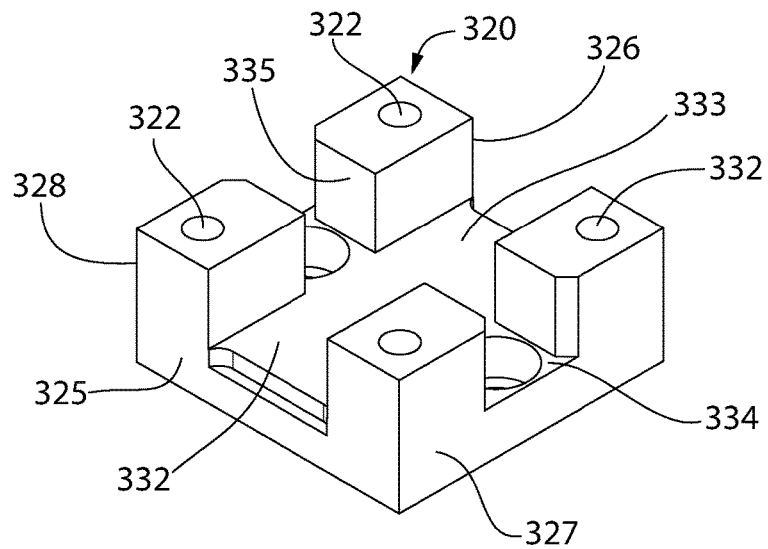
FIG. 19 is a perspective view of a cradle of the mounting substrate of FIG. 15.
Figure 20:
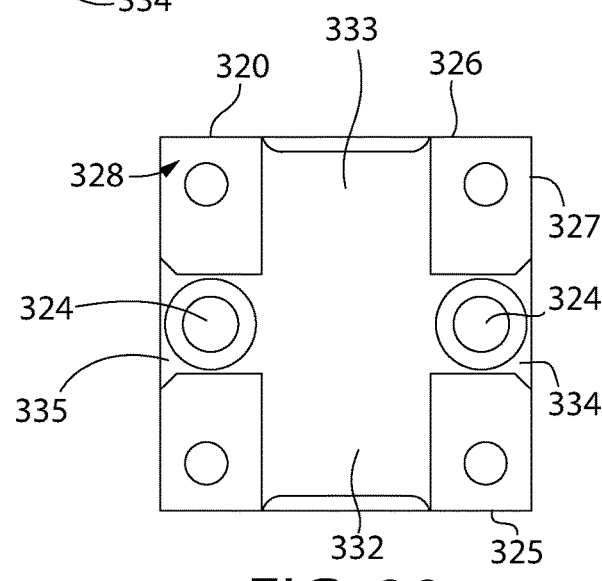
FIG. 20 is a top view of a cradle of the mounting substrate of FIG. 15.
Figure 21:
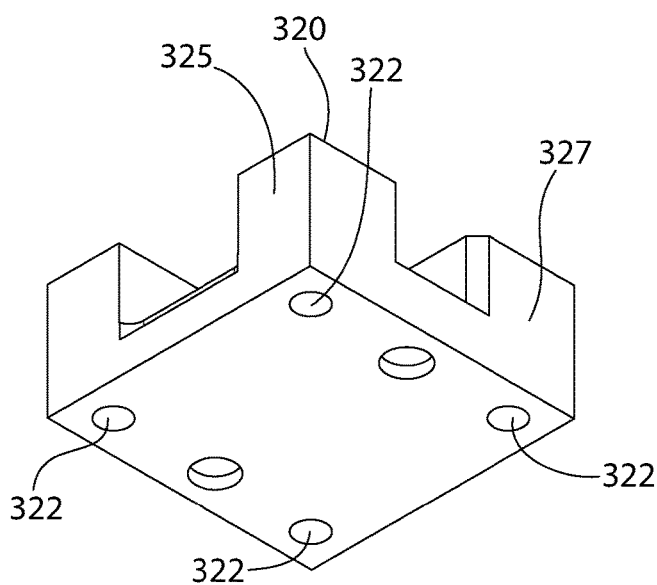
FIG. 21 is a bottom perspective view of a cradle of the mounting substrate of FIG. 15.

Turning to FIGS. 19-21, the cradle 320 is shown in greater detail. The cradle 320 has mounting holes 322 as discussed previously, which are used to attach apparatuses for controlling flow 100. Counterbored holes 324 are used to attach the cradle 320 to a substrate such as a frame, table, or other component to provide mechanical support for the mounting substrate 310 and the apparatus 100. The cradle 320 also has a first side 325, a second side 326, a third side 327, and a fourth side 328. The first side 325 and the second side 326 are opposite one another and the third side 327 and fourth side 328 are opposite one another. A first slot 332 extends through the cradle 320 from the first side 325 toward the second side 326. A second slot 333 extends through the cradle 320 from the second side 326 toward the first side 325. Collectively, the first and second slots 332, 333 extend from the first side 325 to the second side 326.

A third slot 334 extends through the cradle 320 from the third side 327 toward the fourth side 328. A fourth slot 335 extends through the cradle 320 from the fourth side 328 toward the third side 327. Collectively, the third and fourth slots 334, 335 extend from the third side 327 to the fourth side 328. The first and second sides 325, 326 are perpendicular to the third and fourth sides 327, 328. The first and second slots 332, 333 receive the primary channels 402 while the third slot 334 receives the feed channel 504. The fourth slot 335 is left unoccupied. Thus, the outlet manifold 400 extends through the first and second slots 332, 333 and the vacuum manifold 500 extends through one of the third and fourth slots 334, 335. Providing the fourth slot 335 allows greater flexibility in manifold configuration. It is conceived that the vacuum manifold 500 might extend through the fourth slot 335 instead of the third slot 334. It is also conceivable that a third port could be added to the port block 330 to enable connection of three manifolds, allowing different process chambers to be served by the same equipment or providing multiple vacuum manifolds for different fluids or different purposes.

Generally, the first and second slots 332, 333 are wider than the third and fourth slots 334, 335. Generally, the first and second slots 332, 333 are perpendicular to the third and fourth slots 334, 335. However, the slots 332, 333, 334, 335 could be of the same width or the first and second slots 332, 333 could be narrower than the third and fourth slots 334, 335. The slots 332, 333, 334, 335 also need not be parallel or perpendicular to one another and may be arranged at different angles to accommodate manifold channels which are angled at other than right angles.

Figure 22:
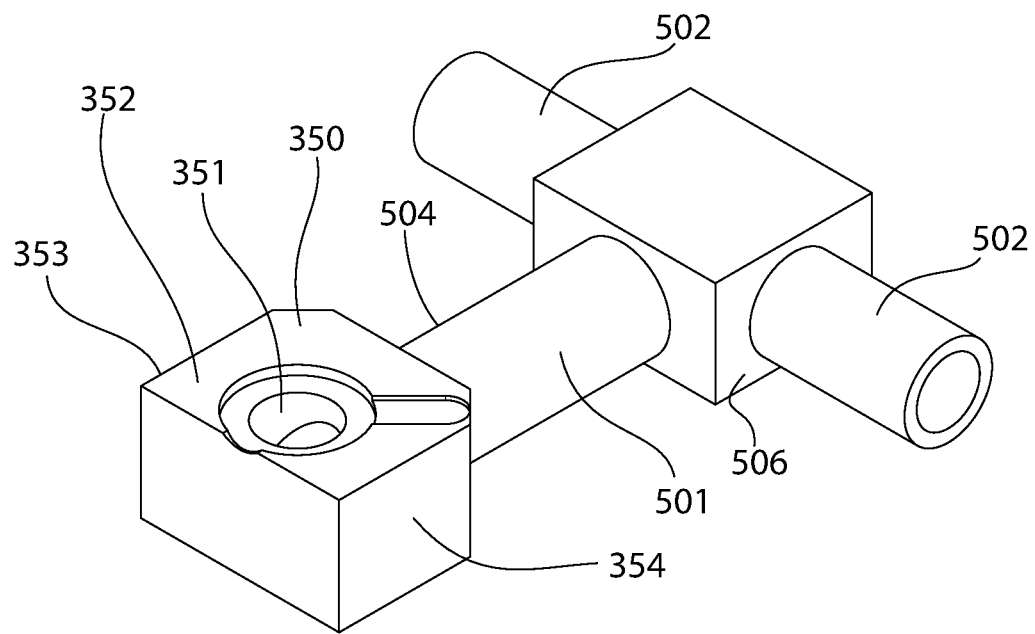
FIG. 22 is a perspective view of a first portion of a port block of the mounting substrate of FIG. 15.
Figure 23:
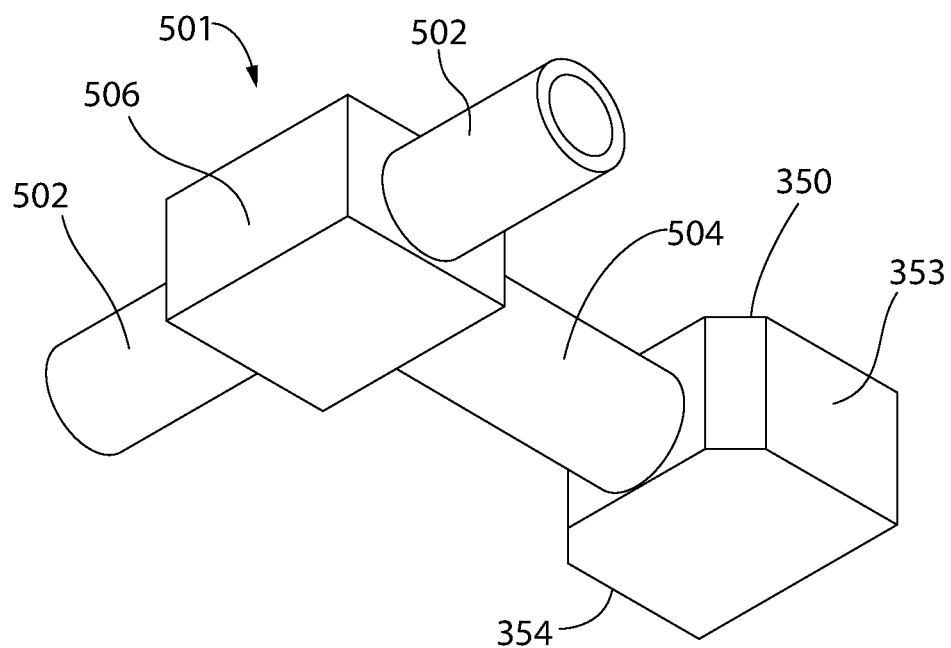
FIG. 23 is a bottom perspective view of the first portion of the port block of the mounting substrate of FIG. 15.

FIGS. 22 and 23 show the second portion 350 of the port block 330 with the portion 501 of the vacuum manifold 500. The vacuum port 351 of the second portion is located on a top surface 352, which can be clearly seen in FIG. 22. The feed channel 504, tee fitting 506, and the primary channels 502 can be seen extending from the second portion 350. The second portion 350 is configured to fit within the third slot 334 and has a width which is approximately equal to the width of the third slot 334 as measured from a first side 353 to a second side 354. The second portion 350 has a height which is substantially equal to a depth of the third slot 334.

Figure 24:
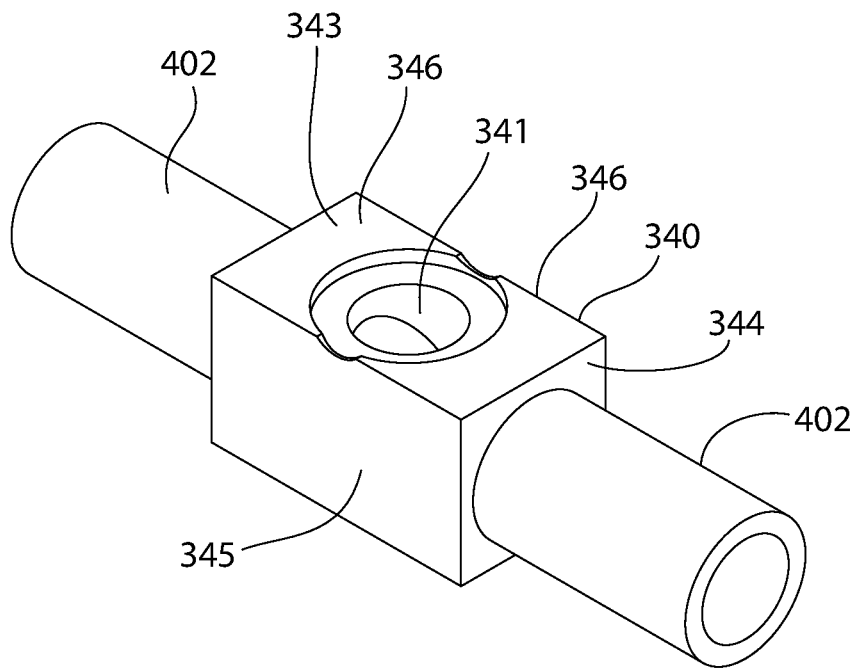
FIG. 24 is a perspective view of a second portion of the port block of the mounting substrate of FIG. 15.
Figure 25:
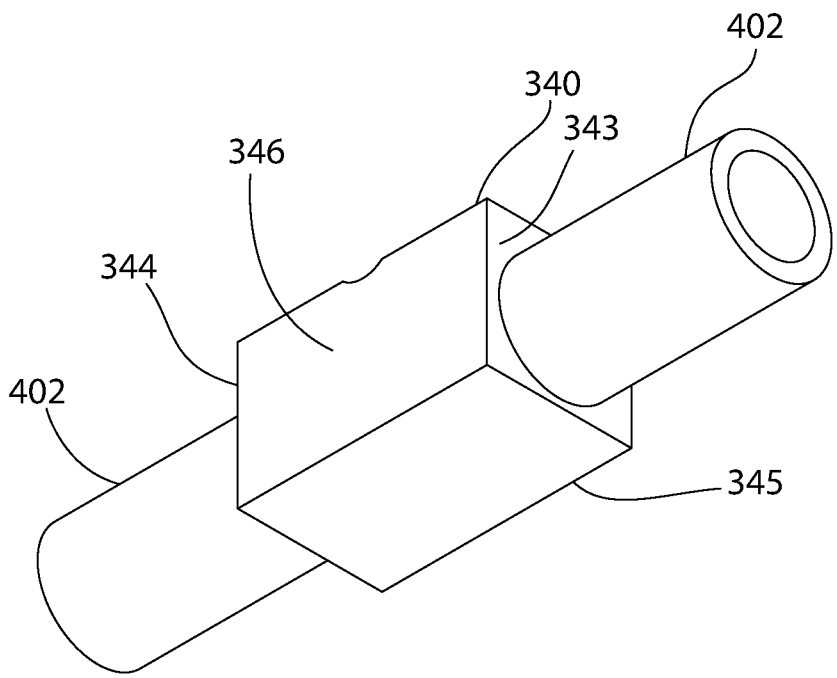
FIG. 25 is a bottom perspective view of the second portion of the port block of the mounting substrate of FIG. 15.

FIGS. 24 and 25 show the first portion 340 of the port block 330 with the portion 401 of the outlet manifold 400. The vacuum port 341 is located on a top surface 342, which can be best seen in FIG. 24. The primary channels 402 can be seen extending from first and second ends 343, 344. The first portion 340 has a width which is approximately equal to the width of the first and second slots 332, 334, the width being measured from a third side 345 to a fourth side 346. The first portion 340 has a height which is substantially equal to a depth of the first and second slots 332, 333.

A method of utilizing the systems described above will now be discussed in greater detail. In a preferred embodiment, the aforementioned systems are used to implement a method of manufacturing articles such as semiconductor devices. In this method, an apparatus for controlling flow 100 is provided, the apparatus 100 comprising a mounting portion 112. A mounting substrate 312 is also provided, the mounting substrate having a surface 312 having an outlet port 341 and a vacuum port 351 formed therein. The outlet port 341 is fluidly coupled to an outlet manifold 400 and the vacuum port 351 is fluidly coupled to a vacuum manifold 500. The outlet manifold 400 is fluidly coupled to a processing chamber 1300 and the vacuum manifold 500 is fluidly coupled to a vacuum source 1200.

A process fluid is supplied to the apparatus 100, the process fluid flows through the apparatus 100 and is delivered to a bleed port 190. The process fluid then flows from the bleed port 190 to the vacuum port 351 because the mounting portion 112 of the apparatus 100 is mounted to the mounting substrate 312 such that the vacuum port 351 is in fluid communication with the bleed port 190. Similarly, the outlet port 341 is in fluid communication with the outlet 110 of the apparatus 100. Process fluid flows from the vacuum port 351 to the vacuum manifold 500 and on to the vacuum source 1200. Similarly, the process fluid flows through the apparatus 100 and is delivered to the outlet 110. In turn, the process fluid flows from the outlet 110 through the outlet port 341 of the mounting substrate and on to the outlet manifold 400. Process fluid then flows to the processing chamber 1300. The process fluid is used to perform a process on an article within the processing chamber. In some embodiments, the article being processed is a semiconductor device or is manufactured into a semiconductor device as a result of the processing performed in the method.

In some embodiments, the process fluid is flowed through the vacuum port 351 before it is flowed through the outlet port 341. In other embodiments the process fluid flows through both the vacuum port 351 simultaneously with flowing through the outlet port 341. In yet other embodiments, the process fluid flows through the outlet port 341 before it flows through the vacuum port 351. In yet further embodiments, a plurality of apparatuses 100 and mounting substrates 312 may be utilized. In these embodiments, a plurality of process fluids may be used, or the same process fluid may be used in more than one apparatus 100. In those embodiments utilizing a plurality of apparatuses 100, more than one apparatus 100 may be active simultaneously. In some embodiments, more than one process fluid may flow through the corresponding vacuum ports 351 and outlet ports 341 simultaneously.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A system for processing articles, the system comprising:
   a first fluid supply configured to supply a first process fluid;
   a second fluid supply configured to supply a second process fluid;
   a first apparatus for controlling flow, the first apparatus having an inlet, an outlet, and a bleed port, the inlet of the first apparatus fluidly coupled to the first fluid supply;
   a second apparatus for controlling flow, the second apparatus having an inlet, an outlet, and a bleed port, the inlet of the second apparatus fluidly coupled to the second fluid supply;
   a first mounting substrate comprising a first vacuum port and a first outlet port, the first apparatus for controlling flow attached to the first mounting substrate such that the bleed port of the first apparatus for controlling flow is fluidly coupled to the first vacuum port and the outlet of the first apparatus for controlling flow is fluidly coupled to the first outlet port;

a second mounting substrate comprising a second vacuum port and a second outlet port, the second apparatus for controlling flow attached to the second mounting substrate such that the bleed port of the second apparatus for controlling flow is fluidly coupled to the second vacuum port and the outlet of the second apparatus for controlling flow is fluidly coupled to the second outlet port;

a vacuum manifold fluidly coupled to the first and second vacuum ports;

an outlet manifold fluidly coupled to the first and second outlet ports;

a vacuum source fluidly coupled to the vacuum manifold; and a processing chamber fluidly coupled to the outlet manifold.

2. The system of claim 1 wherein the vacuum manifold comprises a plurality of primary channels extending along a first longitudinal axis and a plurality of feed channels, the first and second vacuum ports of the first and second mounting substrates fluidly coupled to the plurality of primary channels via the plurality of feed channels and wherein the outlet manifold comprises a plurality of primary channels extending along a second longitudinal axis, the first and second longitudinal axes being parallel.

3. The system of claim 2 wherein the plurality of feed channels extend perpendicular to the first longitudinal axis.

4. The system of claim 2 wherein a first plane intersects the inlet and the outlet of the first apparatus for controlling flow, the first plane being perpendicular to the second longitudinal axis.

5. The system of claim 4 wherein the first plane intersects a first one of the plurality of feed channels.

6. The system of claim 4 wherein a second plane intersects the inlet and the outlet of the second apparatus for controlling flow, the second plane being perpendicular to the second longitudinal axis, and wherein the second plane intersects a second one of the plurality of feed channels.

7. The system of claim 1 wherein each of the first and second mounting substrates comprises a cradle and a port block.

8. The system of claim 7 wherein each of the cradles comprise first, second, third, and fourth slots, the first and second slots extending through the cradle from a first side to an opposite second side and the third and fourth slots extending through the cradle from a third side to an opposite fourth side, the first and second sides being perpendicular to the third and fourth sides, and wherein the outlet manifold extends through the first and second slots and the vacuum manifold extends through one of the third and fourth slots.

9. The system of claim 7 wherein the port block of the first mounting substrate comprises the first vacuum port and the first outlet port and wherein the port block of the second mounting substrate comprises the second vacuum port and the second outlet port.

10. The system of claim 1 wherein the outlet manifold comprises a plurality of primary channels, each of the plurality of primary channels extending along a longitudinal axis.

11. A system for controlling process fluids, the system comprising:
a first apparatus for controlling flow, the first apparatus having an inlet, an outlet, and a bleed port, the inlet of the first apparatus configured to receive a first process fluid;

a second apparatus for controlling flow, the second apparatus having an inlet, an outlet, and a bleed port, the inlet of the second apparatus configured to receive a second process fluid;

a first mounting substrate comprising a first vacuum port and a first outlet port, the first apparatus for controlling flow attached to the first mounting substrate such that the bleed port of the first apparatus for controlling flow is fluidly coupled to the first vacuum port and the outlet of the first apparatus for controlling flow is fluidly coupled to the first outlet port;

a second mounting substrate comprising a second vacuum port and a second outlet port, the second apparatus for controlling flow attached to the second mounting substrate such that the bleed port of the second apparatus for controlling flow is fluidly coupled to the second vacuum port and the outlet of the second apparatus for controlling flow is fluidly coupled to the second outlet port;

a vacuum manifold fluidly coupled to the first and second vacuum ports; and an outlet manifold fluidly coupled to the first and second outlet ports.

12. The system of claim 11 wherein the vacuum manifold comprises a plurality of primary channels extending along a first longitudinal axis and a plurality of feed channels, the first and second vacuum ports of the first and second mounting substrates fluidly coupled to the plurality of primary channels via the plurality of feed channels and wherein the outlet manifold comprises a plurality of primary channels extending along a second longitudinal axis, the first and second longitudinal axes being parallel, and wherein the plurality of feed channels extend perpendicular to the first longitudinal axis.

13. The system of claim 11 wherein each of the first and second mounting substrates comprises a cradle and a port block.

14. The system of claim 13 wherein each of the cradles comprise first, second, third, and fourth slots, the first and second slots extending through the cradle from a first side to an opposite second side and the third and fourth slots extending through the cradle from a third side to an opposite fourth side, the first and second sides being perpendicular to the third and fourth sides, and wherein the outlet manifold extends through the first and second slots and the vacuum manifold extends through one of the third and fourth slots.

15. The system of claim 13 wherein the port block of the first mounting substrate comprises the first vacuum port and the first outlet port, and wherein the port block of the second mounting substrate comprises the second vacuum port and the second outlet port.

16. The system of claim 11 wherein the manifold comprises a plurality of primary channels connecting adjacent ones of the mounting substrates, each of the plurality of primary channels extending along a longitudinal axis.

\* \* \* \* \*